(12) United States Patent
Lin et al.

(10) Patent No.: US 6,949,408 B1
(45) Date of Patent: Sep. 27, 2005

(54) METHOD OF CONNECTING A CONDUCTIVE TRACE AND AN INSULATIVE BASE TO A SEMICONDUCTOR CHIP USING MULTIPLE ETCH STEPS

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 10/356,372

(22) Filed: Feb. 1, 2003

Related U.S. Application Data

(63) Continuation-in-part of application No. 10/188,459, filed on Jul. 3, 2002, now Pat. No. 6,576,493, which is a continuation-in-part of application No. 09/972,796, filed on Oct. 6, 2001, now Pat. No. 6,667,229, which is a continuation-in-part of application No. 09/962,754, filed on Sep. 24, 2001, now Pat. No. 6,673,710, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, said application No. 09/972,796, is a continuation-in-part of application No. 09/917,339, filed on Jul. 27, 2001, now Pat. No. 6,537,851, which is a continuation-in-part of application No. 09/878,626, which is a continuation-in-part of application No. 09/687,619.

(51) Int. Cl.⁷ .................. H01L 21/44; H01L 21/48; H01L 21/50
(52) U.S. Cl. ................ 438/107; 438/108; 438/119; 438/121; 438/124; 438/126
(58) Field of Search ............... 438/107, 108, 438/119, 121, 124, 126

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |

(Continued)

FOREIGN PATENT DOCUMENTS

| | | | | |
|---|---|---|---|---|
| EP | 0 718 882 A1 | 6/1996 | | H01L/23/057 |
| WO | WO 97/38563 | 10/1997 | | H05K/1/03 |
| WO | WO 99/57762 | 11/1999 | | H01L/23/48 |

OTHER PUBLICATIONS

Markstein et al., "Controlling the Variables in Stencil Printing," Electronic Packaging & Production, Feb. 1997, pp. 48–56.

(Continued)

*Primary Examiner*—David Nelms
*Assistant Examiner*—Renee R. Berry
(74) *Attorney, Agent, or Firm*—David M. Sigmond

(57) ABSTRACT

A method of making a semiconductor chip assembly includes providing a semiconductor chip, a metal base, an insulative base and a conductive trace, wherein the chip includes a conductive pad, the metal base is disposed on a side of the insulative base that faces away from the chip, the conductive trace includes a contact terminal that extends through the insulative base, and the pad is exposed through an opening that extends through the metal base and the insulative base and is spaced from the contact terminal, then forming a connection joint that contacts and electrically connects the conductive trace and the pad, and then removing a portion of the metal base that contacts the contact terminal. Preferably, the opening extends through an insulative adhesive that attaches the chip to the conductive trace.

300 Claims, 30 Drawing Sheets

U.S. PATENT DOCUMENTS

| | | |
|---|---|---|
| 5,090,119 A | 2/1992 | Tsuda et al. .................. 29/843 |
| 5,106,461 A | 4/1992 | Volfson et al. ............. 205/125 |
| 5,116,463 A | 5/1992 | Lin et al. ..................... 156/653 |
| 5,137,845 A | 8/1992 | Lochon et al. ............... 437/183 |
| 5,167,992 A | 12/1992 | Lin et al. ..................... 427/437 |
| 5,172,851 A | 12/1992 | Matsushita et al. ......... 228/179 |
| 5,196,371 A | 3/1993 | Kulesza et al. ............. 437/183 |
| 5,209,817 A | 5/1993 | Ahmad et al. ............... 156/643 |
| 5,237,130 A | 8/1993 | Kulesza et al. ............. 174/260 |
| 5,260,234 A | 11/1993 | Long ........................... 437/203 |
| 5,261,593 A | 11/1993 | Casson et al. ......... 228/180.22 |
| 5,275,330 A | 1/1994 | Isaacs et al. ............. 228/180.2 |
| 5,284,796 A | 2/1994 | Nakanishi et al. .......... 437/183 |
| 5,293,067 A | 3/1994 | Thompson et al. ......... 257/668 |
| 5,294,038 A | 3/1994 | Nakano et al. .......... 228/179.1 |
| 5,327,010 A | 7/1994 | Uenaka et al. ............... 257/679 |
| 5,334,804 A | 8/1994 | Love et al. .................. 174/267 |
| 5,346,750 A | 9/1994 | Hatakeyama et al. ....... 428/209 |
| 5,355,283 A | 10/1994 | Marrs et al. ................ 361/760 |
| 5,358,621 A | 10/1994 | Oyama ....................... 205/123 |
| 5,364,004 A | 11/1994 | Davidson ..................... 228/1.1 |
| 5,397,921 A | 3/1995 | Karnezos ..................... 257/779 |
| 5,407,864 A | 4/1995 | Kim ............................. 473/203 |
| 5,424,245 A | 6/1995 | Gurtler et al. ............... 437/183 |
| 5,438,477 A | 8/1995 | Pasch .......................... 361/689 |
| 5,439,162 A | 8/1995 | George et al. ......... 228/180.22 |
| 5,447,886 A | 9/1995 | Rai .............................. 437/183 |
| 5,454,161 A | 10/1995 | Beilin et al. .................. 29/852 |
| 5,454,928 A | 10/1995 | Rogers et al. ............. 205/125 |
| 5,475,236 A | 12/1995 | Yoshizaki ..................... 257/48 |
| 5,477,933 A | 12/1995 | Nguyen ....................... 174/262 |
| 5,478,007 A | 12/1995 | Marrs ..................... 228/180.22 |
| 5,483,421 A | 1/1996 | Gedney et al. ............. 361/771 |
| 5,484,647 A | 1/1996 | Nakatani et al. ............ 428/209 |
| 5,485,949 A | 1/1996 | Tomura et al. .......... 228/180.5 |
| 5,487,218 A | 1/1996 | Bhatt et al. ................... 29/852 |
| 5,489,804 A | 2/1996 | Pasch .......................... 257/778 |
| 5,493,096 A | 2/1996 | Koh ....................... 219/121.71 |
| 5,508,229 A | 4/1996 | Baker .......................... 437/183 |
| 5,525,065 A | 6/1996 | Sobhani ....................... 439/67 |
| 5,536,973 A | 7/1996 | Yamaji ........................ 257/737 |
| 5,542,601 A | 8/1996 | Fallon et al. ................ 228/119 |
| 5,547,740 A | 8/1996 | Higdon et al. ............... 428/209 |
| 5,556,810 A | 9/1996 | Fujitsu ........................ 437/209 |
| 5,556,814 A | 9/1996 | Inoue et al. ................. 437/230 |
| 5,564,181 A | 10/1996 | Dineen et al. ................ 29/841 |
| 5,572,069 A | 11/1996 | Schneider .................... 257/690 |
| 5,576,052 A | 11/1996 | Arledge et al. ............... 427/98 |
| 5,583,073 A | 12/1996 | Lin et al. ..................... 439/183 |
| 5,595,943 A | 1/1997 | Itabashi et al. ............. 437/230 |
| 5,599,744 A | 2/1997 | Koh et al. ................... 437/195 |
| 5,611,140 A | 3/1997 | Kulesza et al. ............... 29/832 |
| 5,611,884 A | 3/1997 | Bearinger et al. .......... 156/325 |
| 5,613,296 A | 3/1997 | Kurino et al. ................ 29/852 |
| 5,614,114 A | 3/1997 | Owen ..................... 219/121.66 |
| 5,615,477 A | 4/1997 | Sweitzer ...................... 29/840 |
| 5,619,791 A | 4/1997 | Lambrecht, Jr. et al. ...... 29/852 |
| 5,627,405 A | 5/1997 | Chillara ...................... 257/668 |
| 5,627,406 A | 5/1997 | Pace ........................... 257/700 |
| 5,633,204 A | 5/1997 | Tago et al. .................. 438/614 |
| 5,637,920 A | 6/1997 | Loo ............................. 257/700 |
| 5,641,113 A | 6/1997 | Somaki et al. ......... 228/180.22 |
| 5,645,628 A | 7/1997 | Endo et al. ................. 106/1.23 |
| 5,646,067 A | 7/1997 | Gaul ........................... 437/180 |
| 5,648,686 A | 7/1997 | Hirano et al. ............... 257/778 |
| 5,654,584 A | 8/1997 | Fujitsu ........................ 257/666 |
| 5,656,858 A | 8/1997 | Kondo et al. ............... 257/737 |
| 5,663,598 A | 9/1997 | Lake et al. .................. 257/737 |
| 5,665,652 A | 9/1997 | Shimizu ...................... 438/127 |
| 5,666,008 A | 9/1997 | Tomita et al. ............... 257/778 |
| 5,669,545 A | 9/1997 | Pham et al. .................. 228/1.1 |
| 5,674,785 A | 10/1997 | Akram et al. ............... 437/217 |
| 5,674,787 A | 10/1997 | Zhao et al. .................. 437/230 |
| 5,682,061 A | 10/1997 | Khandros et al. ........... 257/666 |
| 5,686,353 A | 11/1997 | Yagi et al. ................... 437/183 |
| 5,691,041 A | 11/1997 | Frankeny et al. ............ 428/209 |
| 5,722,162 A | 3/1998 | Chou et al. ................... 29/852 |
| 5,723,369 A | 3/1998 | Barber ........................ 438/106 |
| 5,731,223 A | 3/1998 | Padmanabhan ............. 437/183 |
| 5,736,456 A | 4/1998 | Akram ........................ 438/614 |
| 5,739,585 A | 4/1998 | Akram et al. ............... 257/698 |
| 5,744,859 A | 4/1998 | Ouchida ..................... 257/668 |
| 5,757,071 A | 5/1998 | Bhansali ..................... 257/697 |
| 5,757,081 A | 5/1998 | Chang et al. ............... 257/778 |
| 5,764,486 A | 6/1998 | Pendse ........................ 361/774 |
| 5,774,340 A | 6/1998 | Chang et al. ............... 361/771 |
| 5,789,271 A | 8/1998 | Akram ........................ 438/18 |
| 5,798,285 A | 8/1998 | Bentlage et al. ............ 438/108 |
| 5,801,072 A | 9/1998 | Barber ........................ 438/107 |
| 5,801,447 A | 9/1998 | Hirano et al. ............... 257/778 |
| 5,803,340 A | 9/1998 | Yeh et al. .................. 228/56.3 |
| 5,804,771 A | 9/1998 | McMahon et al. .......... 174/255 |
| 5,808,360 A | 9/1998 | Akram ........................ 257/738 |
| 5,811,879 A | 9/1998 | Akram ........................ 257/723 |
| 5,813,115 A | 9/1998 | Misawa et al. ............... 29/832 |
| 5,817,541 A | 10/1998 | Averkiou et al. ............ 438/107 |
| 5,822,856 A | 10/1998 | Bhatt et al. ................... 29/832 |
| 5,834,844 A | 11/1998 | Akagawa et al. ............ 257/734 |
| 5,861,666 A | 1/1999 | Bellaar ........................ 257/686 |
| 5,863,816 A | 1/1999 | Cho ............................ 438/123 |
| 5,870,289 A | 2/1999 | Tokuda et al. ............... 361/779 |
| 5,883,435 A | 3/1999 | Geffken et al. ............. 257/758 |
| 5,925,931 A | 7/1999 | Yamamoto ................... 257/737 |
| 5,994,222 A | 11/1999 | Smith et al. ................. 438/689 |
| 6,012,224 A | 1/2000 | DiStefano et al. ............ 29/840 |
| 6,013,877 A | 1/2000 | Degani et al. .............. 174/264 |
| 6,017,812 A | 1/2000 | Yonezawa et al. .......... 438/613 |
| 6,018,196 A | 1/2000 | Noddin ....................... 257/777 |
| 6,020,561 A | 2/2000 | Ishida et al. ................. 174/261 |
| 6,037,665 A | 3/2000 | Miyazaki ..................... 257/773 |
| 6,046,909 A | 4/2000 | Joy ............................. 361/748 |
| 6,084,297 A | 7/2000 | Brooks et al. .............. 257/698 |
| 6,084,781 A | 7/2000 | Klein .......................... 361/771 |
| 6,088,236 A | 7/2000 | Tomura et al. .............. 361/783 |
| 6,103,552 A | 8/2000 | Lin .............................. 438/113 |
| 6,103,992 A | 8/2000 | Noddin .................. 219/121.71 |
| 6,127,204 A | 10/2000 | Isaacs et al. ................. 438/106 |
| 6,159,770 A | 12/2000 | Tetaka et al. ................ 438/112 |

OTHER PUBLICATIONS

Elenius, "Choosing a Flip Chip Bumping Supplier—Technology an IC Package contractor should look for," Advanced Packaging, Mar./Apr. 1998, pp. 70–73.

Ghaffarian, "Long Time BGA Assembly Reliability," Advancing Microelectronics, vol. 25, No. 6, Sep./Oct. 1998, pp. 20–23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via–Fill".

U.S. Appl. No. 09/464,561, filed Dec. 16, 1999, entitled "Bumpless Flip Chip Assembly With Strips–In–Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through–Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

METHOD OF CONNECTING A CONDUCTIVE TRACE AND AN INSULATIVE BASE TO A SEMICONDUCTOR CHIP USING MULTIPLE ETCH STEPS

CROSS-REFERENCE TO RELATED APPLICATIONS

This application is a continuation-in-part of U.S. application Ser. No. 10/188,459 filed Jul. 3, 2002 now U.S. Pat. No. 6,576,493, which is incorporated by reference.

The '459 application is a continuation-in-part of U.S. application Ser. No. 09/972,796 filed Oct. 6, 2001, now U.S. Pat. No. 6,667,229, which is incorporated by reference.

The '796 application is a continuation-in-part of U.S. application Ser. No. 09/962,754 filed Sep. 24, 2001, now U.S. Pat. No. 6,673,710, which is a continuation-in-part of U.S. application Ser. No. 09/878,626 filed Jun. 11, 2001, now U.S. Pat No. 6,653,217, which is a continuation-in-part of U.S. application Ser. No. 09/687,619 filed Oct. 13, 2000, now U.S. Pat. No. 6,440,835, each of which is incorporated by reference.

The '796 application is also a continuation-in-part of U.S. application Ser. No. 09/917,339 filed Jul. 27, 2001, now U.S. Pat. No. 6,537,851, which is a continuation-in-part of U.S. application Ser. No. 09/878,626 filed Jun. 11, 2001, now U.S. Pat. No. 6,653,217, which is a continuation-in-part of U.S. application Ser. No. 09/687,619 filed Oct. 13, 2001, now U.S. Pat. No. 6,440,835, each of which is incorporated by reference.

BACKGROUND OF THE INVENTION

1. Field of the Invention

The present invention relates to a semiconductor chip assembly, and more particularly to a method of connecting a conductive trace and an insulative base to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flipchip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-pattered substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during powerup of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, and provides excellent mechanical and electrical performance.

SUMMARY OF THE INVENTION

An object of the present invention is to provide a semiconductor chip assembly with a chip, a conductive trace and an insulative base that provides a low cost, high performance, high reliability package.

Another object of the present invention is to provide a convenient, cost-effective method for manufacturing semiconductor chip assemblies as grid arrays or other structures.

In accordance with an aspect of the invention, a method of making a semiconductor chip assembly includes providing a semiconductor chip, a metal base, an insulative base and a conductive trace, wherein the chip includes a conductive pad, the metal base is disposed on a side of the insulative base that faces away from the chip, the conductive trace includes a contact terminal that extends through the insulative base, and the pad is exposed through an opening that extends through the metal base and the insulative base and is spaced from the contact terminal, then forming a connection joint that contacts and electrically connects the conductive trace and the pad, and then removing a portion of the metal base that contacts the contact terminal.

The method may include mechanically attaching the chip to the conductive trace using an insulative adhesive, and then forming the opening through the metal base, the insulative base and the adhesive.

The method may also include providing the conductive trace with the contact terminal and a routing line, wherein the routing line is disposed on a side of the insulative base that faces towards the chip and overlaps the pad.

The method may also include providing a laminated structure that includes the metal base, the insulative base and a metal layer, wherein the metal base and the metal layer are disposed on opposite sides of the insulative base, and selectively etching the metal layer such that an unetched portion of the metal layer forms at least a portion of the routing line.

The method may also include forming a via that extends through the metal layer and the insulative base and into the metal base, and depositing the contact terminal into the via.

The method may also include forming the via by mechanically drilling through the metal layer and the insulative base and into the metal base, and then etching the metal base and the metal layer in the via such that the metal base and the metal layer are recessed relative to the insulative base in the via.

The method may also include depositing a first portion of the contact terminal into the via and on the metal base, then depositing a second portion of the contact terminal into the via and on the first portion of the contact terminal and the metal layer. Preferably, the first portion of the contact terminal is deposited by electroplating, and the second portion of the contact terminal is deposited by electroless plating followed by electroplating.

The method may also include forming the opening by applying a wet chemical etch to the metal base, thereby exposing the insulative base, and then applying a laser that ablates the insulative base and the adhesive, thereby exposing the routing line and the pad.

The method may also include depositing an insulator in the opening that contacts the insulative base and the connection joint, thereby protecting the connection joint from a wet chemical etch that removes the portion of the metal base that contacts the contact terminal.

The method may also include removing the portion of the metal base that contacts the contact terminal such that the metal base no longer electrically connects the contact terminal to other contact terminals, thereby electrically isolating the pad from other pads.

Preferably, the metal base, the metal layer and the connection joint are copper, and the contact terminal includes a non-copper metal layer that contacts the metal base and a copper layer that is spaced from the metal base.

An advantage of the present invention is that the semiconductor chip assembly includes a conductive trace with an additively formed contact terminal that can be manufactured conveniently and cost effectively. Another advantage is that the insulative base can be provided before the metal base is removed, thereby enhancing the mechanical support and protection for the conductive trace when the metal base is removed. Another advantage is that the contact terminal can be filled with a compressible material such as the adhesive or an encapsulant, thereby permitting the contact terminal to exhibit compliance for the next level assembly. Another advantage is that the connection joint need not include wire bonds, TAB leads or solder joints. Another advantage is that the metal base, the metal layer and the connection joint can be copper. Another advantage is that the assembly can be manufactured using low temperature processes which reduces stress and improves reliability. A further advantage is that the assembly can be manufactured using well controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 4A:
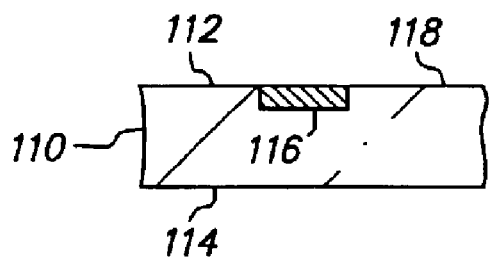
FIGS. 4A–4U are cross-sectional views corresponding to FIGS. 1A–1U, respectively.
Figure 4B:
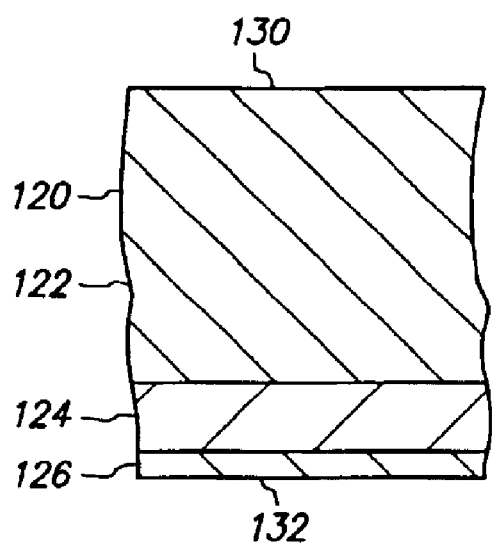
Figure 4C:
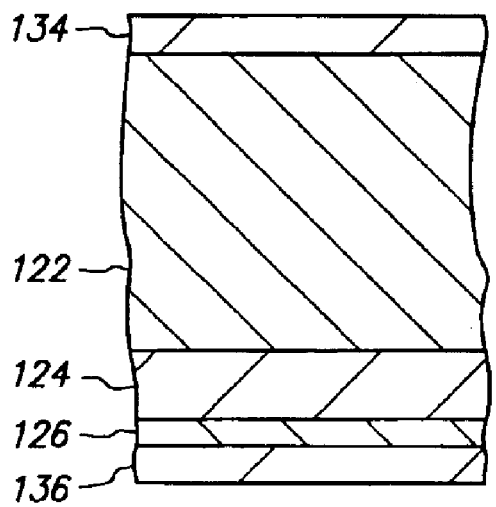
Figure 4D:
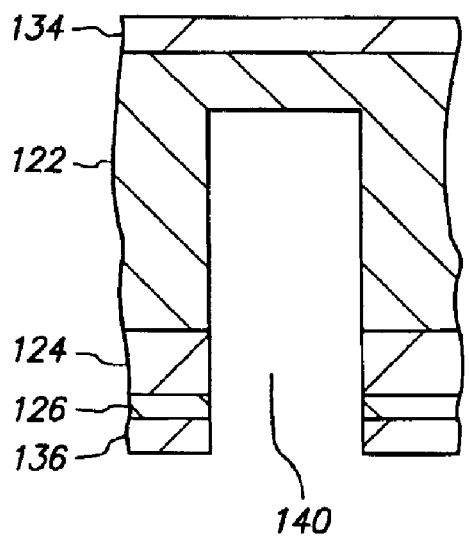
Figure 4E:
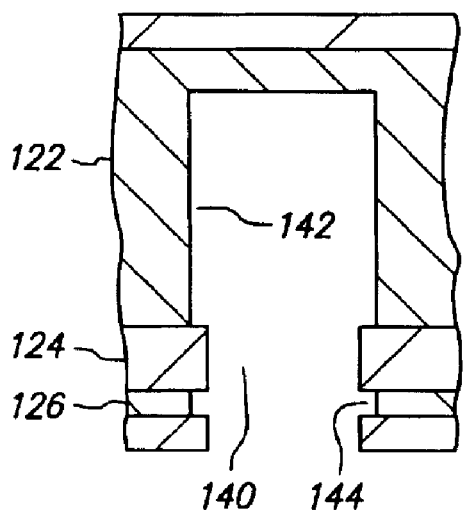
Figure 4F:
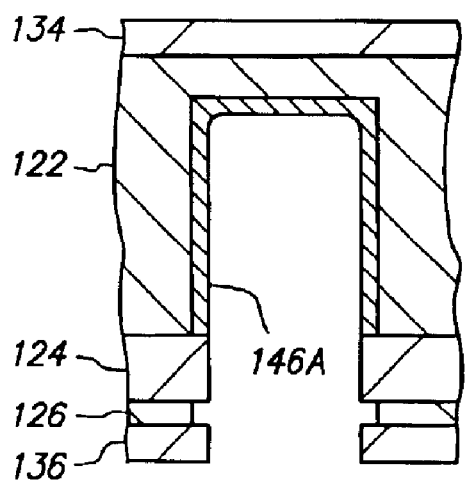
Figure 4G:
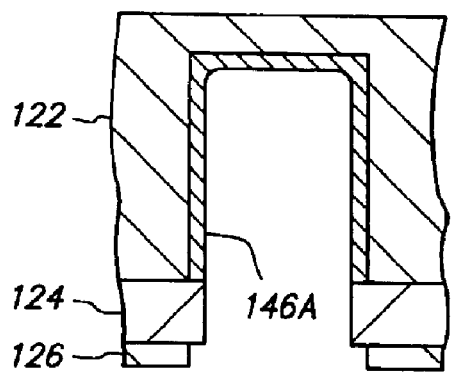
Figure 4H:
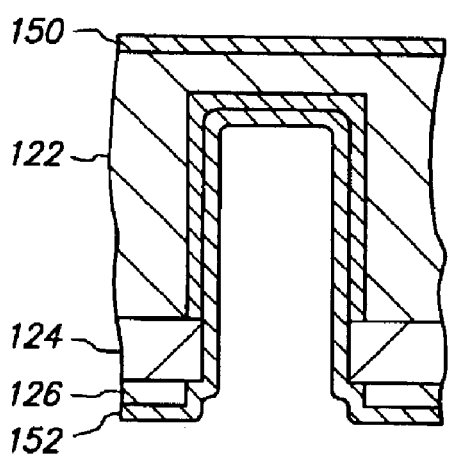
Figure 4I:
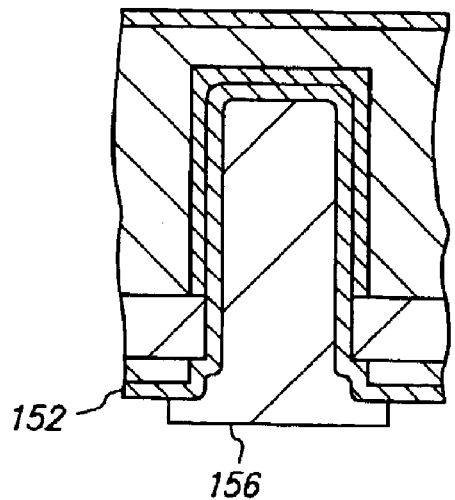
Figure 4J:
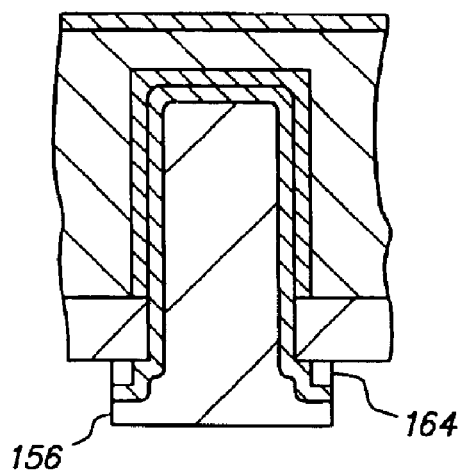
Figure 4K:
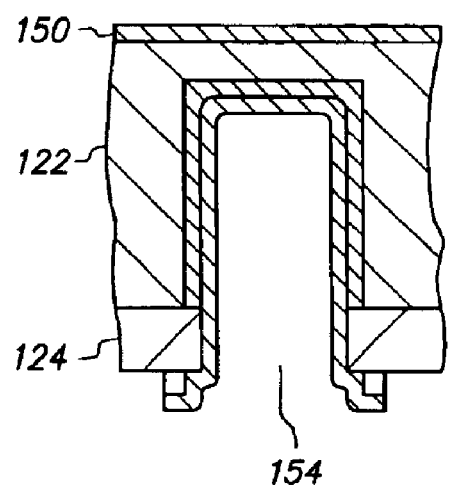
Figure 4L:
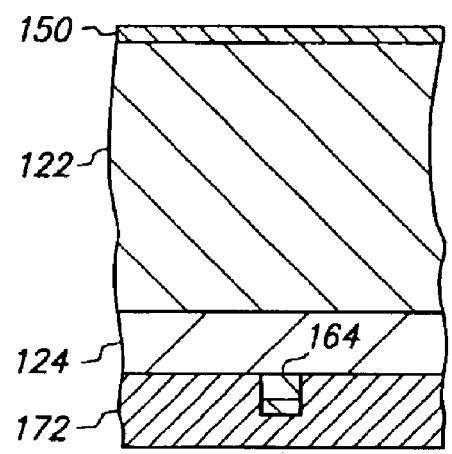
Figure 4M:
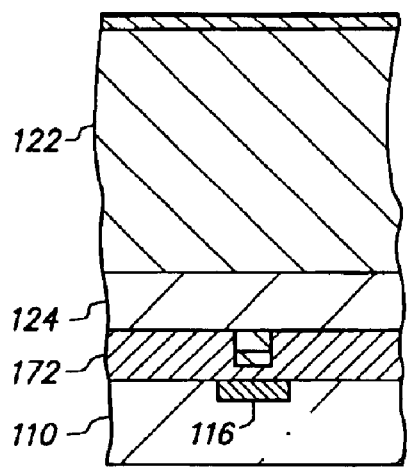
Figure 4N:
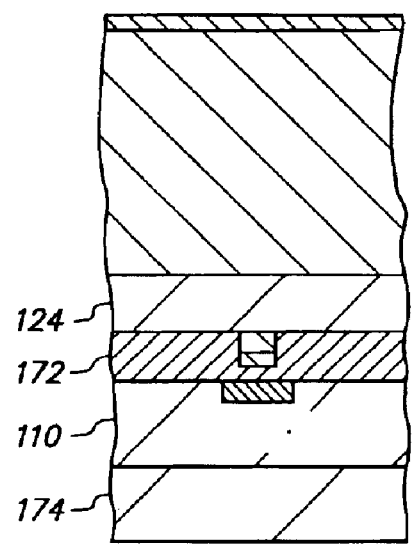
Figure 4O:
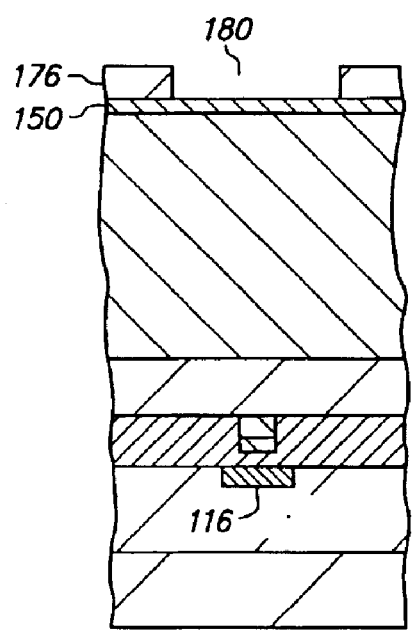
Figure 4P:
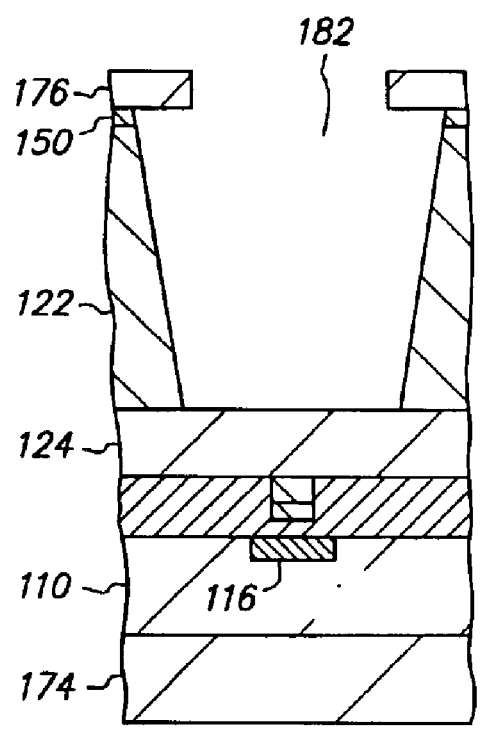
Figure 4Q:
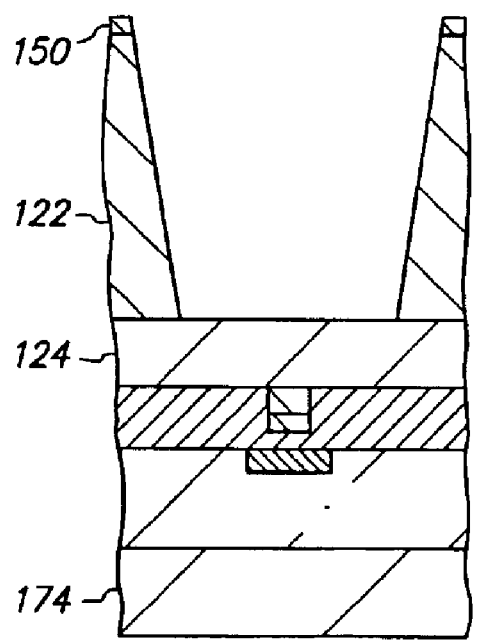
Figure 4R:
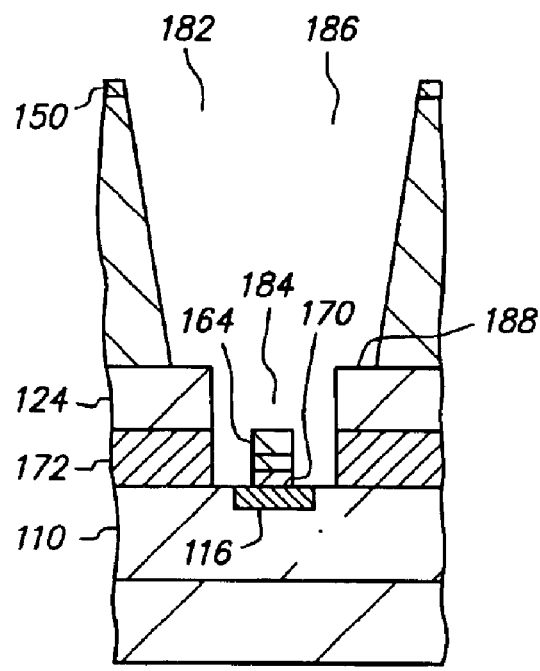
Figure 4S:
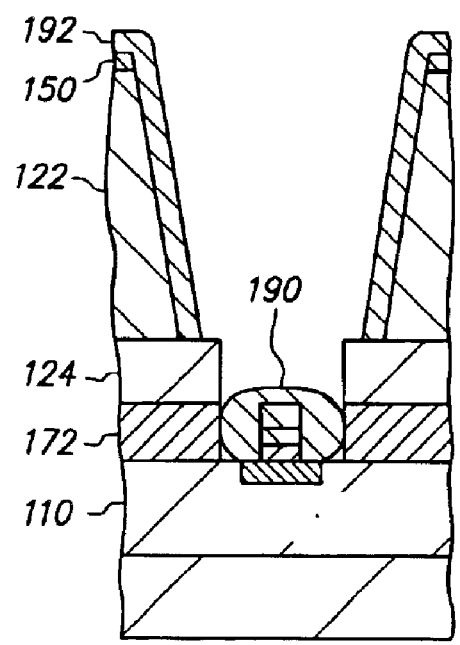
Figure 4T:
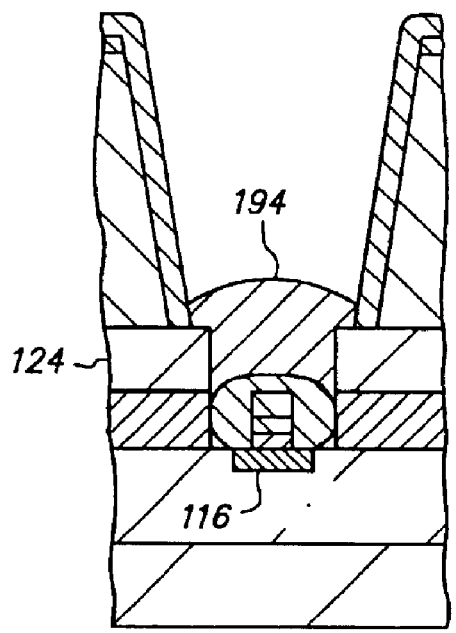
Figure 4U:
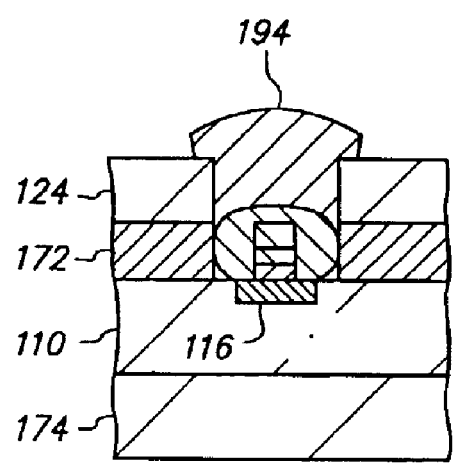

FIGS. 1A–1U, 2A–2U, 3A–3U and 4A–4U are cross-sectional, top, bottom and cross-sectional views, respectively, of a method of making a semiconductor chip assembly in accordance with an embodiment of the present invention. FIGS. 4A–4U are oriented orthogonally with respect to FIGS. 1A–1U and depict FIGS. 1A–1U as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 includes conductive pad 116 and passivation layer 118. Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water. Thereafter, pad 116 is treated to provide a surface layer that will accommodate a subsequently formed connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 can be treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, a nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of laminated structure 120 which induces metal base 122, insulative base 124 and metal layer 126. Laminated structure 120 also includes opposing major surfaces 130 and 132 at metal base 122 and metal layer 126, respectively. Thus, laminated structure 120 is a diclad laminate in which insulative base 124 adhesively attaches metal base 122 and metal layer 126, and metal base 122 and metal layer 126 are separated from one another. Metal base 122 is a copper foil with a thickness of 200 microns, insulative base 124 is a thermoplastic polyimide layer with a thickness of 50 microns; and metal layer 126 is a copper foil with a thickness of 12 microns.

Figure 1A:
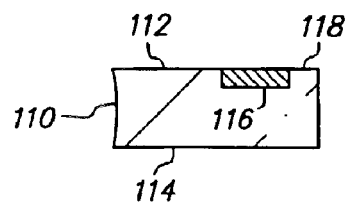
FIGS. 1A–1U are cross-sectional views showing a method of making a semiconductor chip assembly in accordance with an embodiment of the present invention.
Figure 2A:
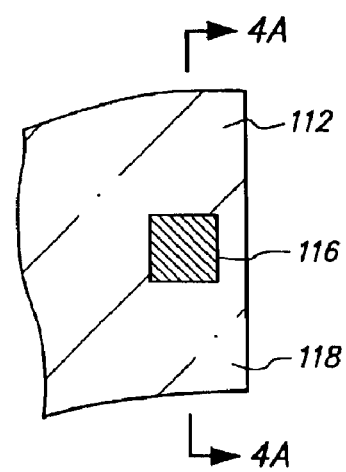
FIGS. 2A–2U are top plan views corresponding to FIGS. 1A–1U, respectively.
Figure 3A:
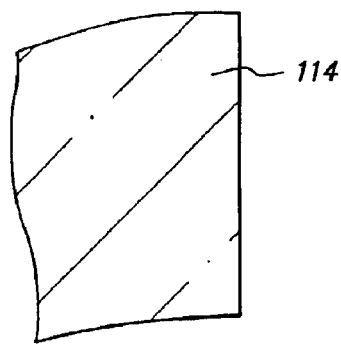
FIGS. 3A–3U are bottom plan views corresponding to FIGS. 1A–1U, respectively.
Figure 1B:
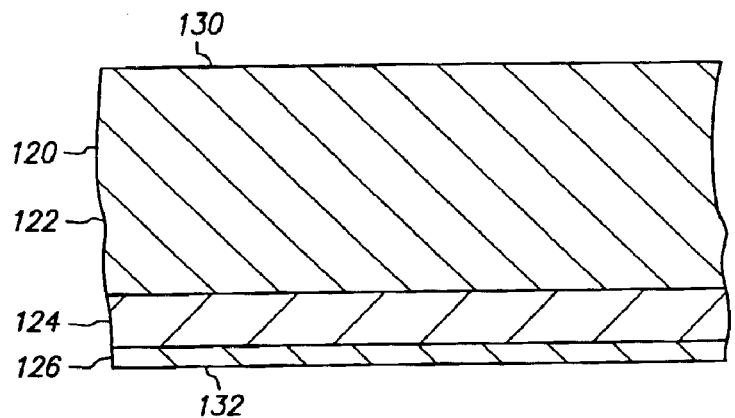
Figure 2B:
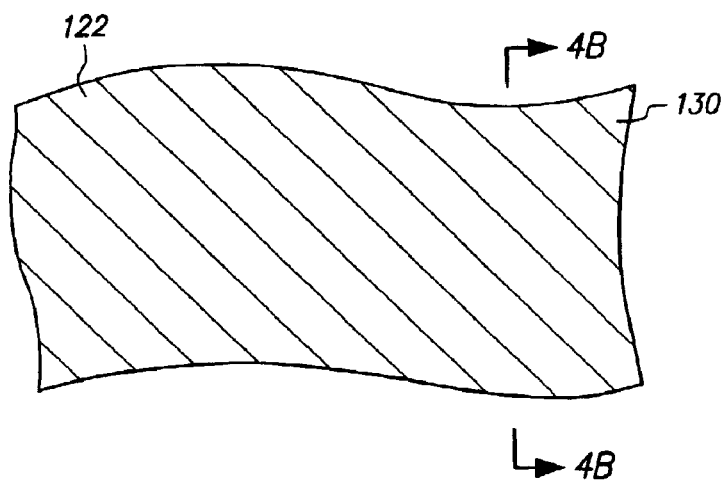
Figure 3B:
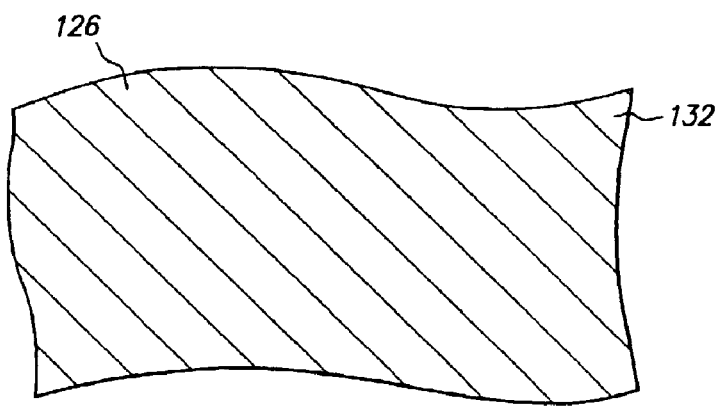
Figure 1C:
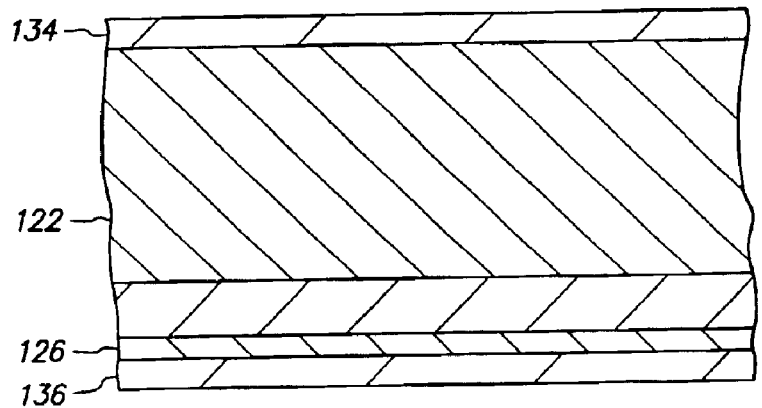
Figure 2C:
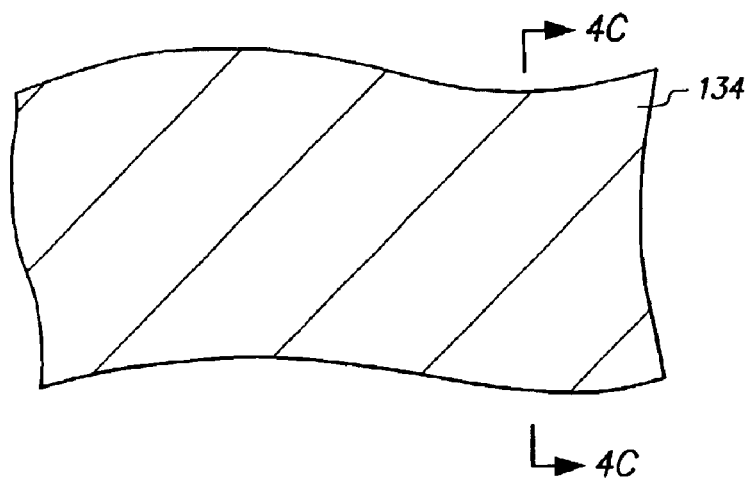
Figure 3C:
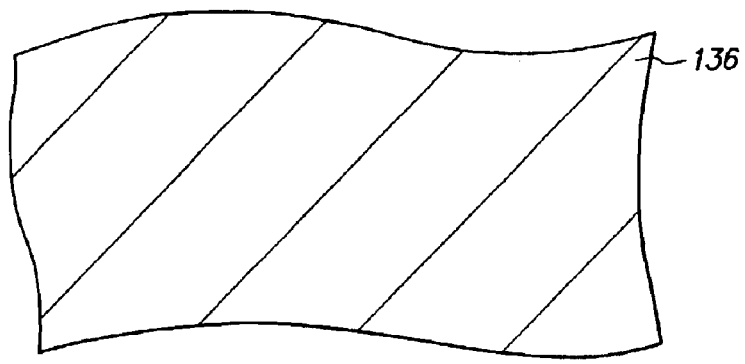
Figure 1D:
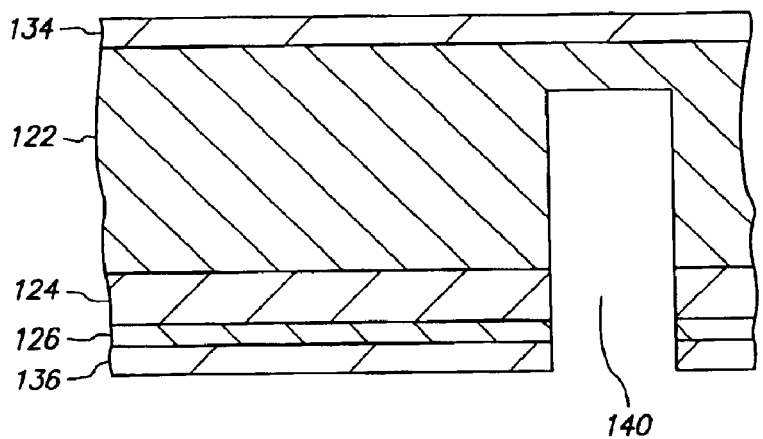
Figure 2D:
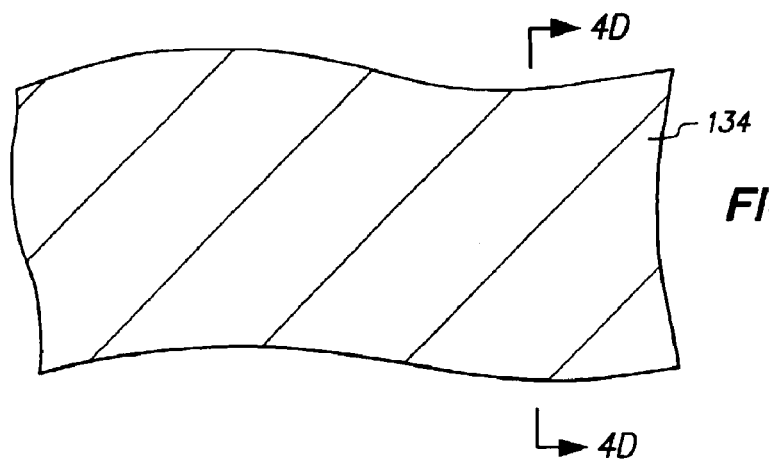
Figure 3D:
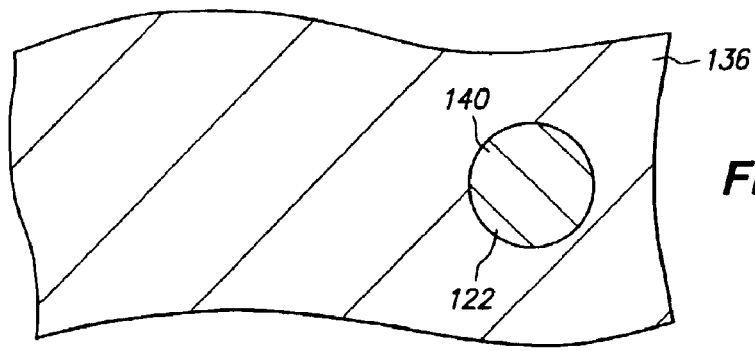
Figure 1E:
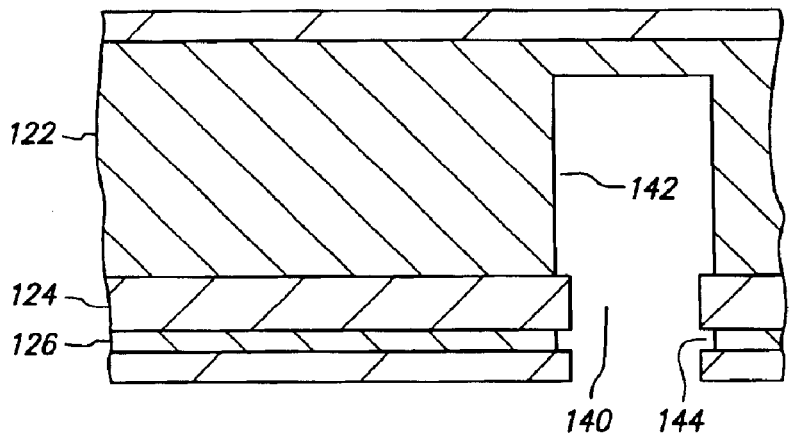
Figure 2E:
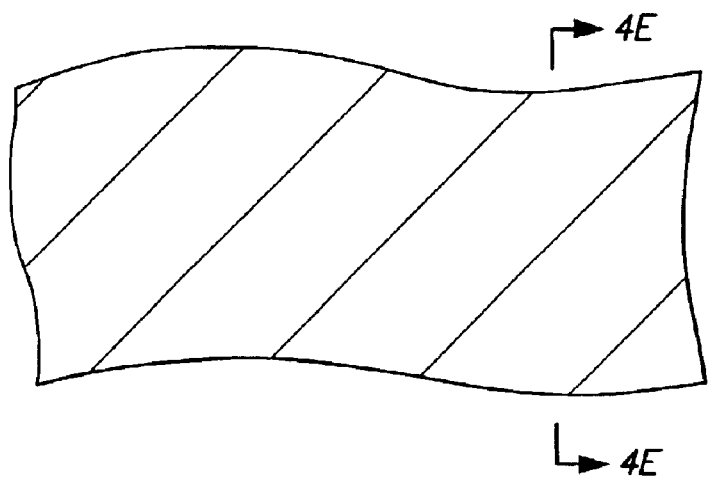
Figure 3E:
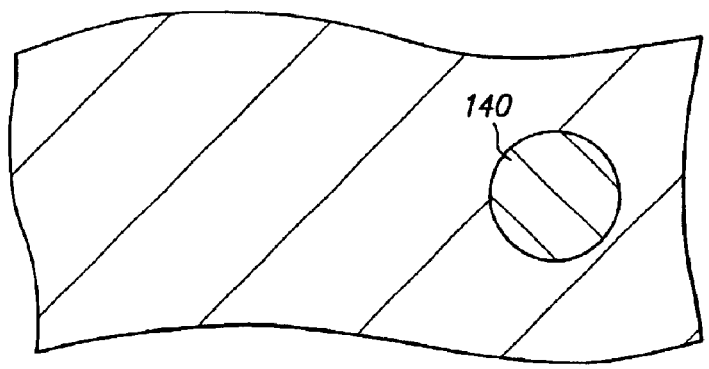
Figure 1F:
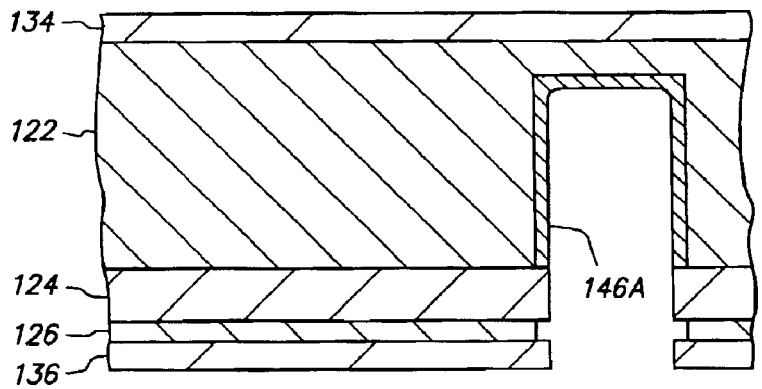
Figure 2F:
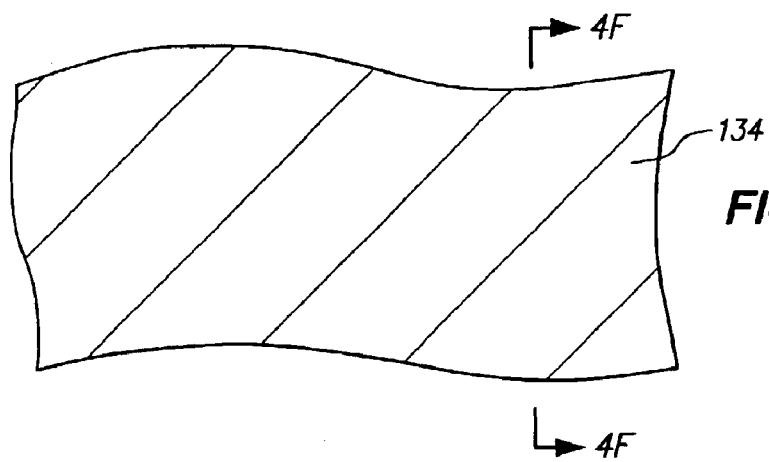
Figure 3F:
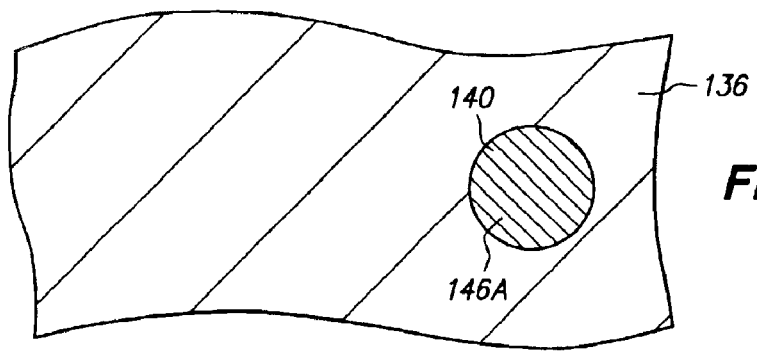
Figure 1G:
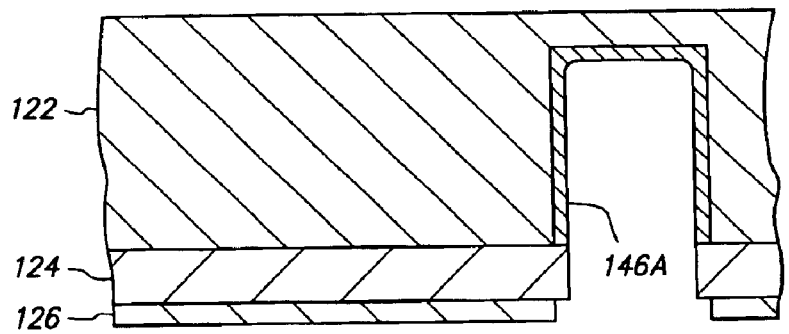
Figure 2G:
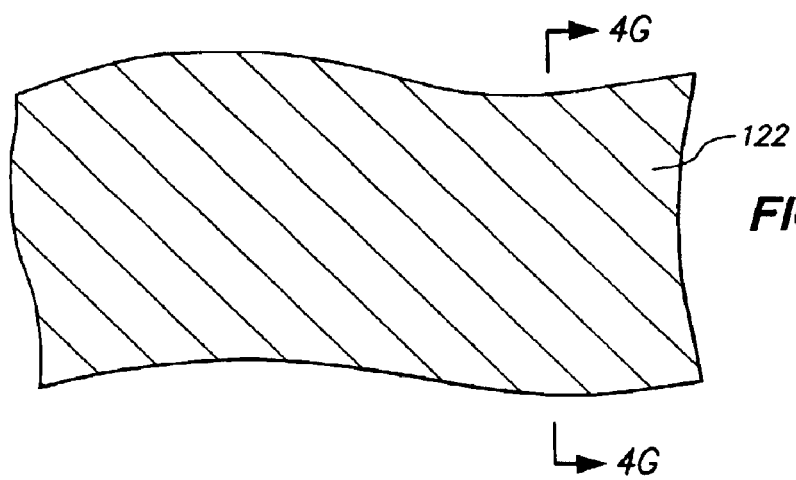
Figure 3G:
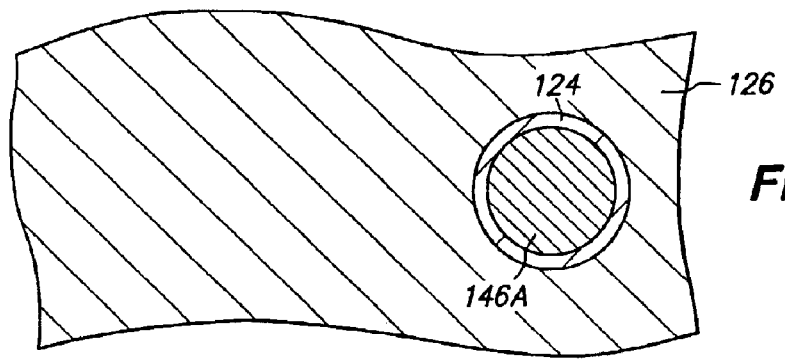
Figure 1H:
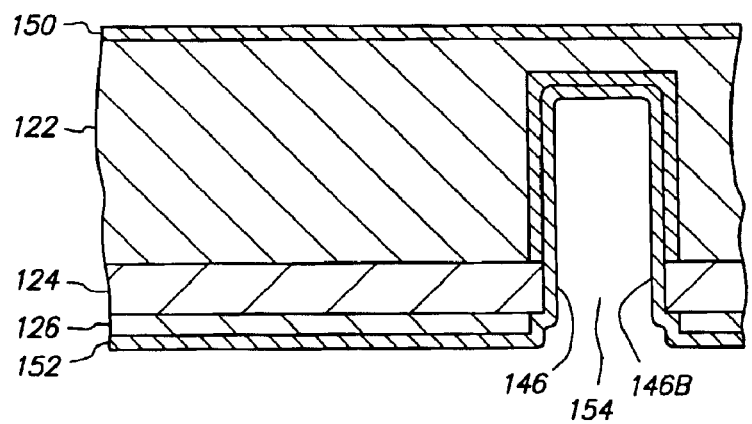
Figure 2H:
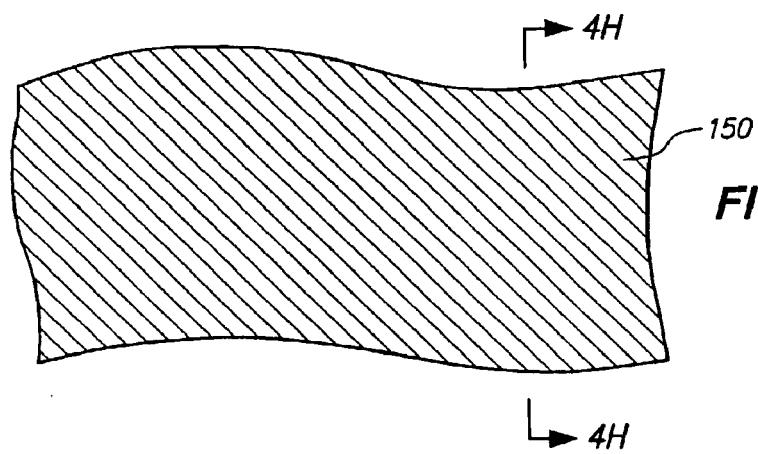
Figure 3H:
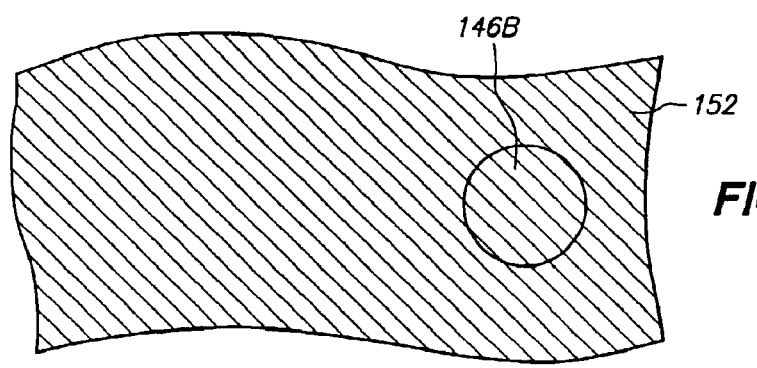
Figure 1I:
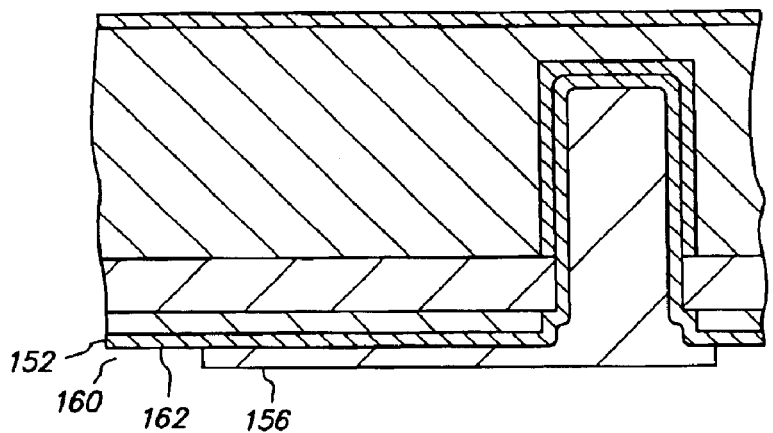
Figure 2I:
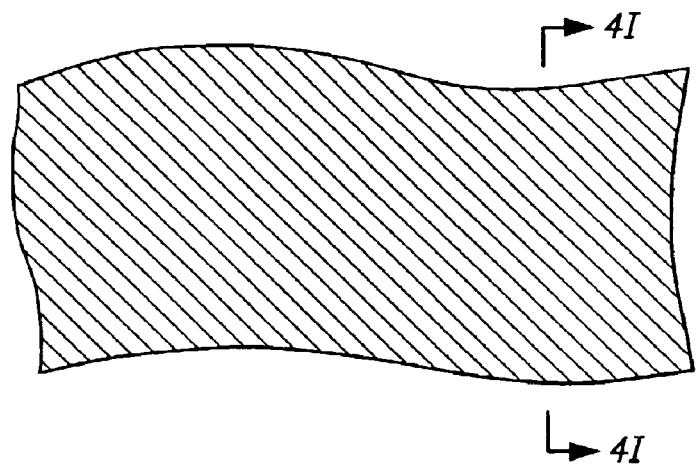
Figure 3I:
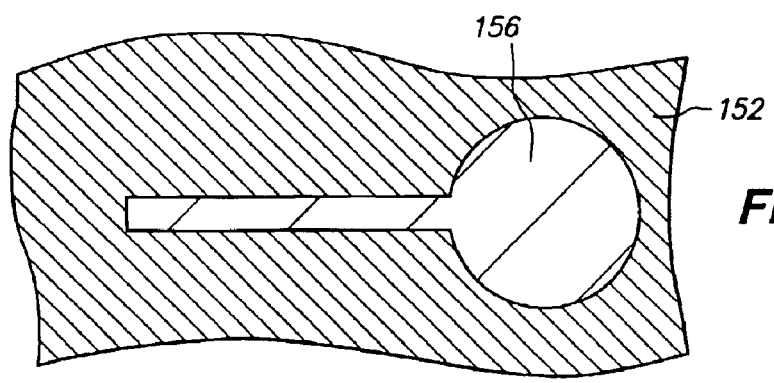
Figure 1J:
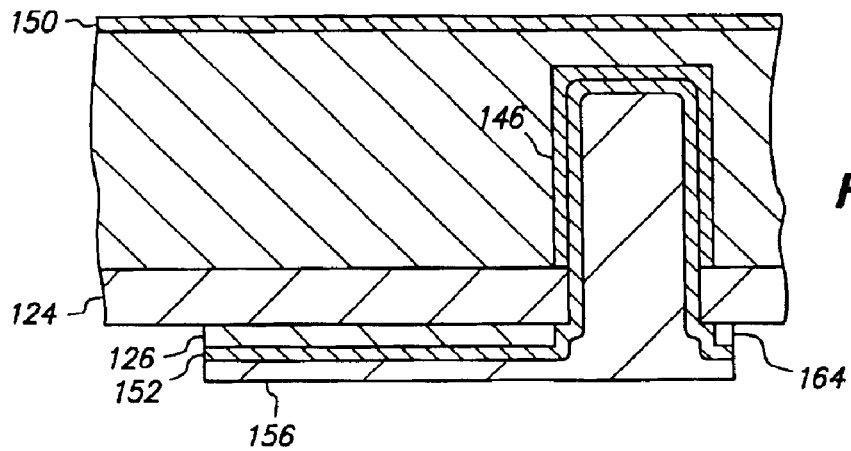
Figure 2J:
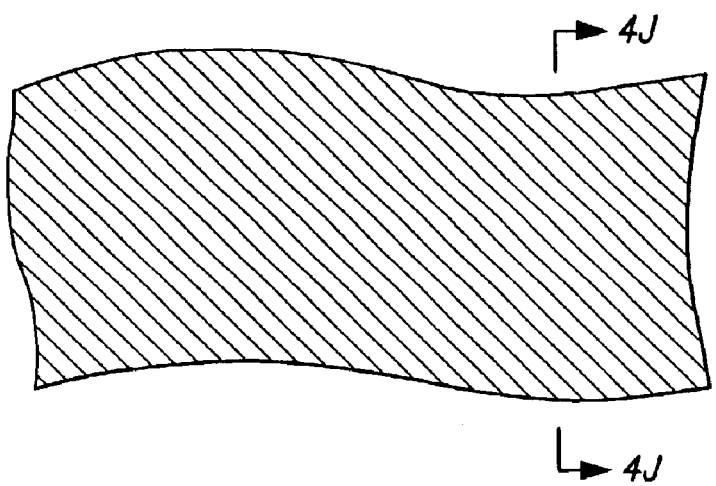
Figure 3J:
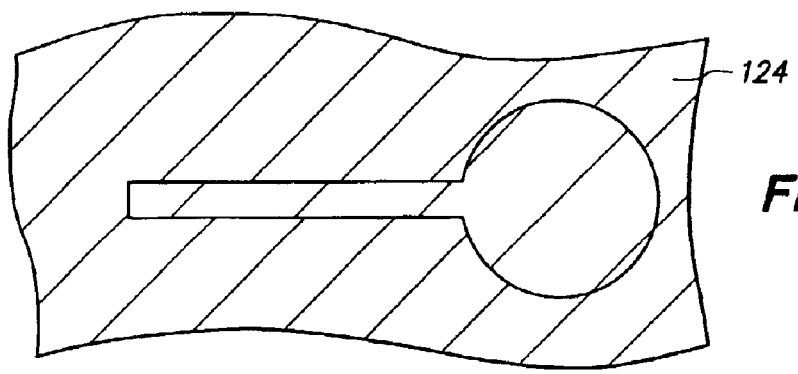
Figure 1K:
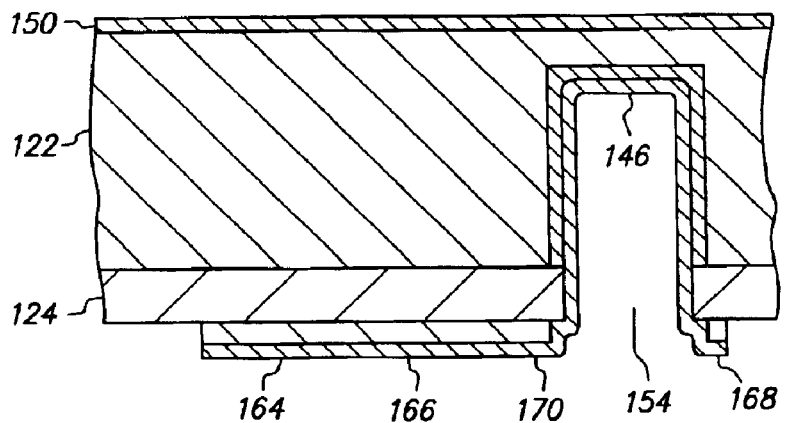
Figure 2K:
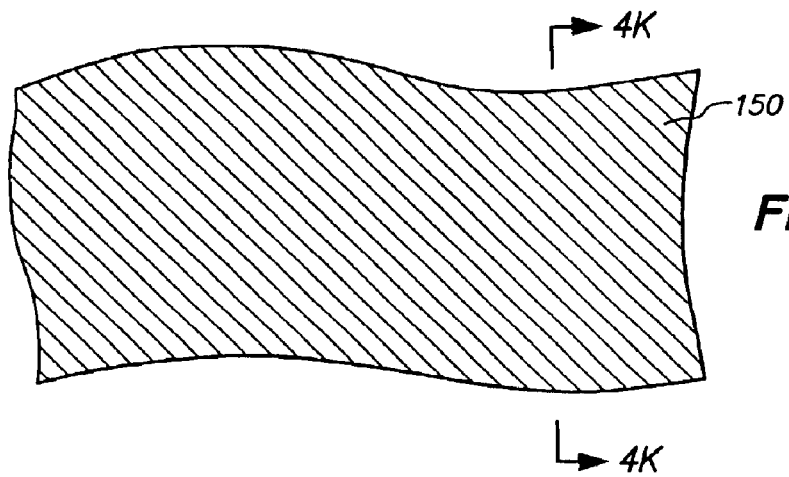
Figure 3K:
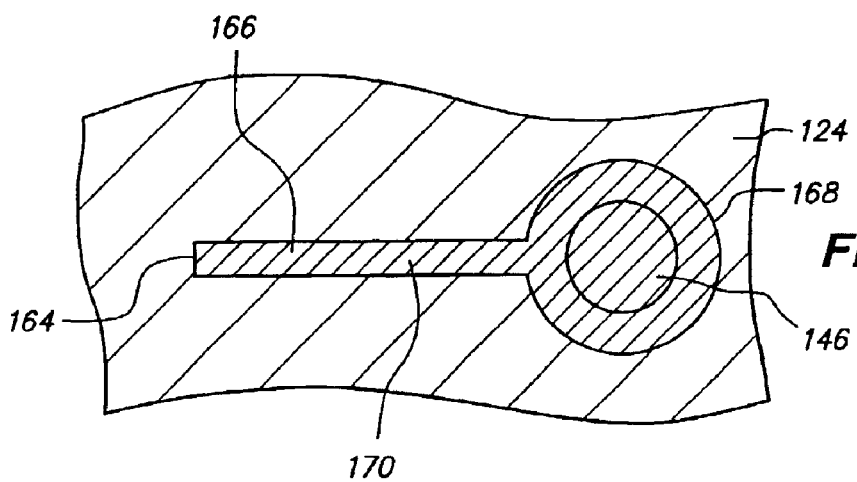
Figure 1L:
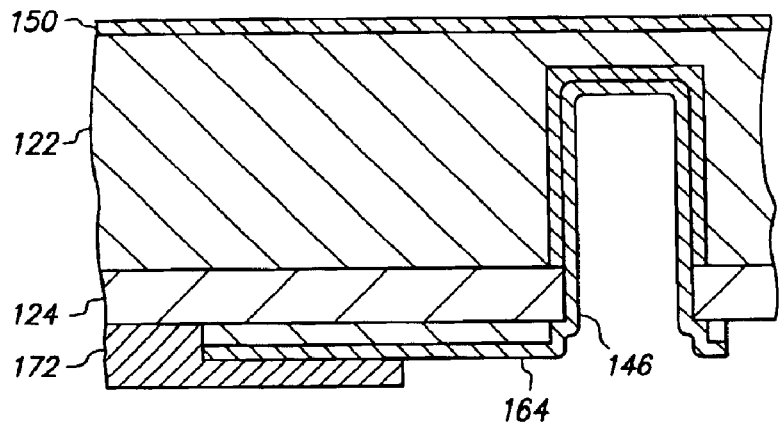
Figure 2L:
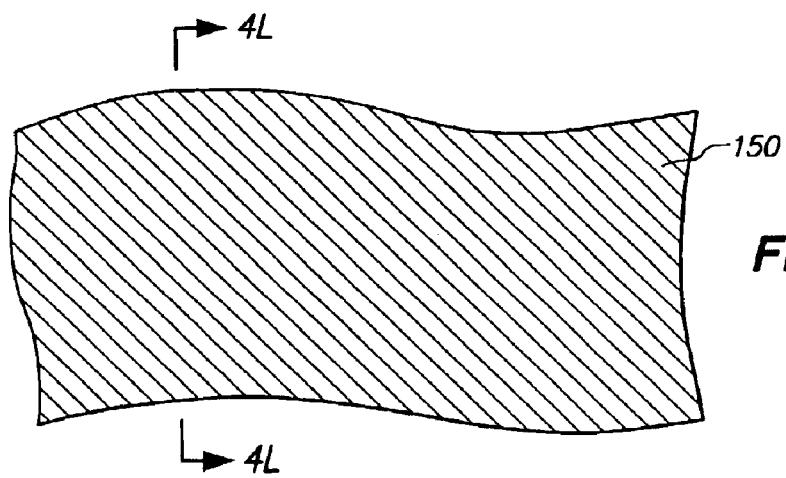
Figure 3L:
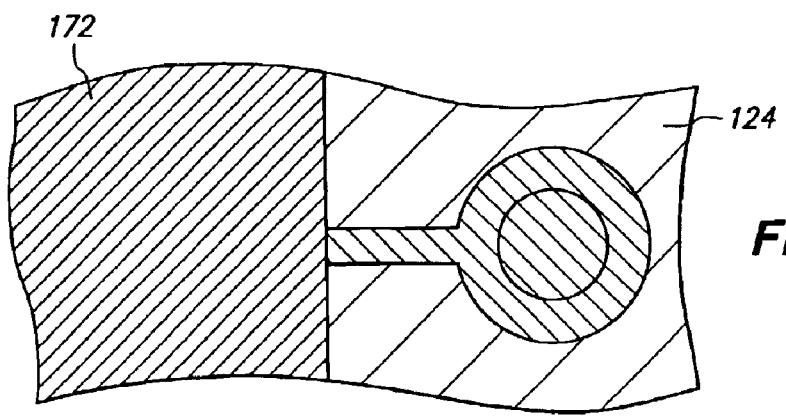
Figure 1M:
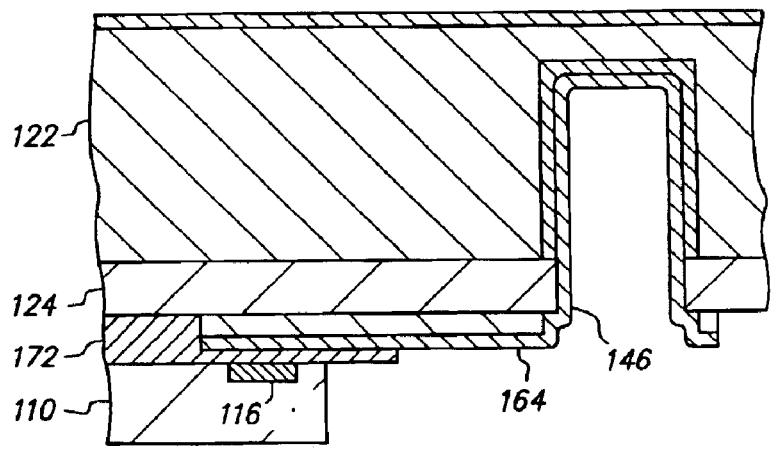
Figure 2M:
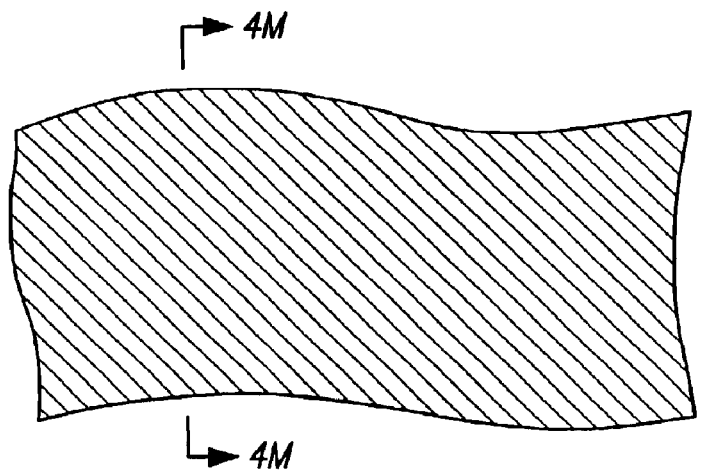
Figure 3M:
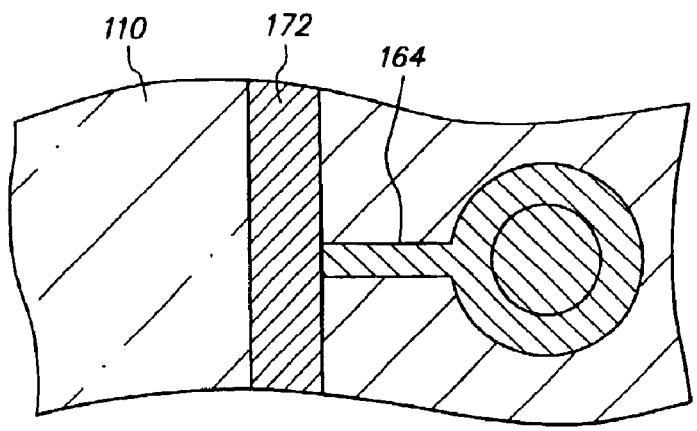
Figure 1N:
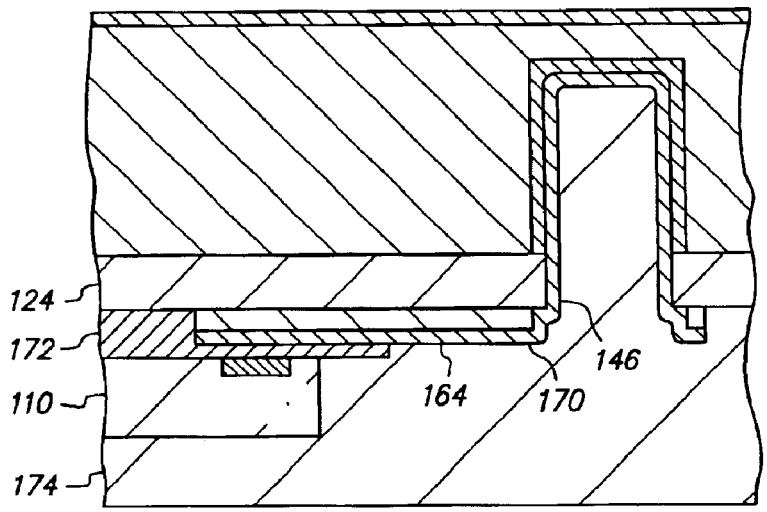
Figure 2N:
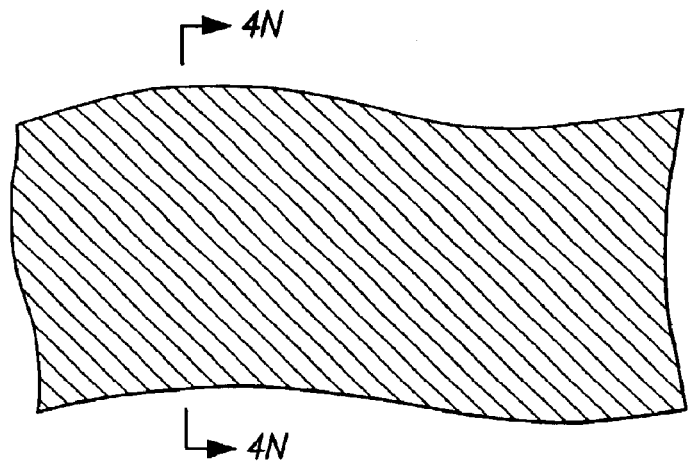
Figure 3N:
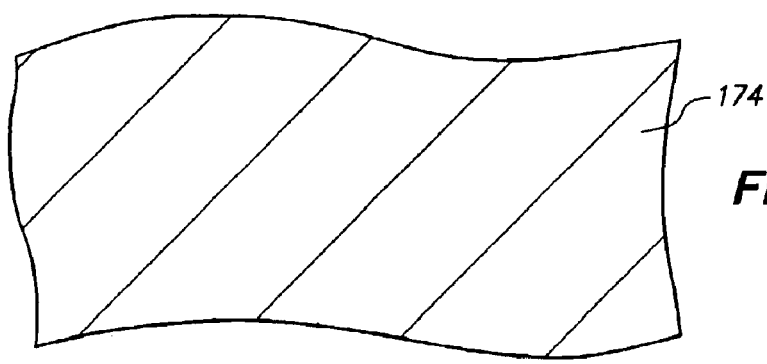
Figure 10:
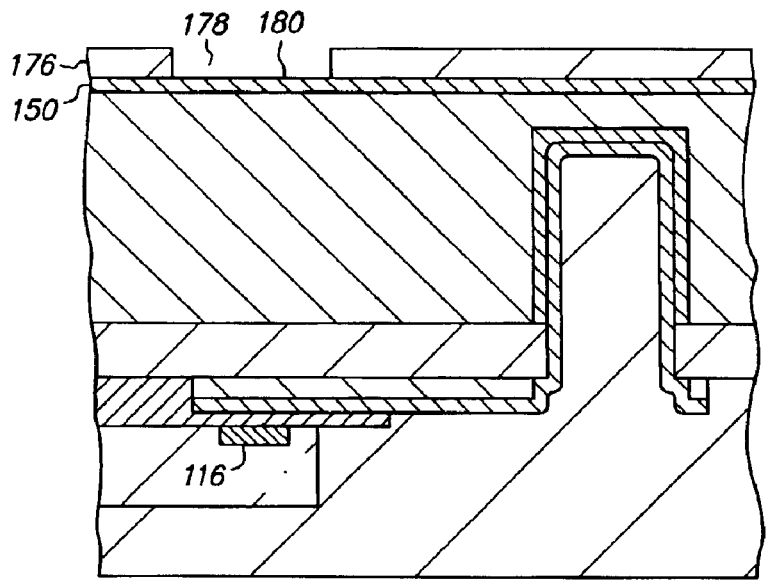
Figure 20:
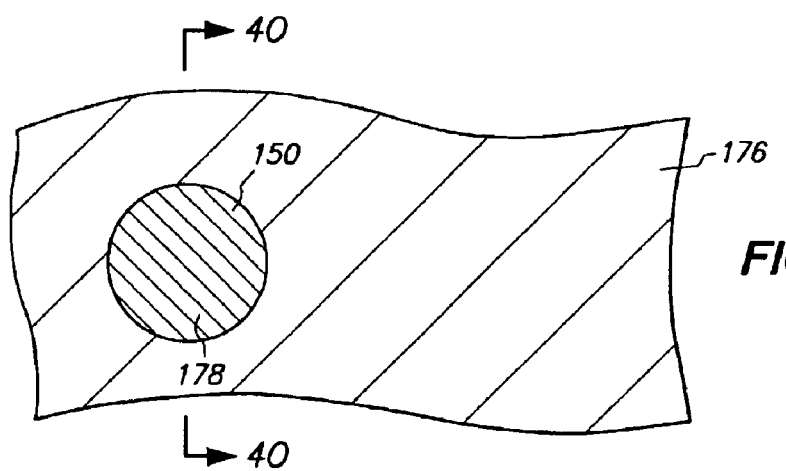
Figure 30:
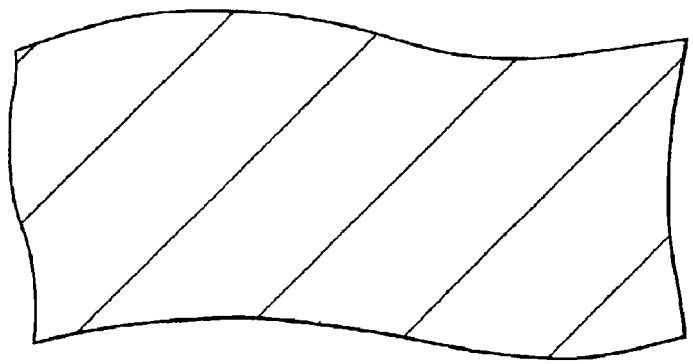
Figure 1P:
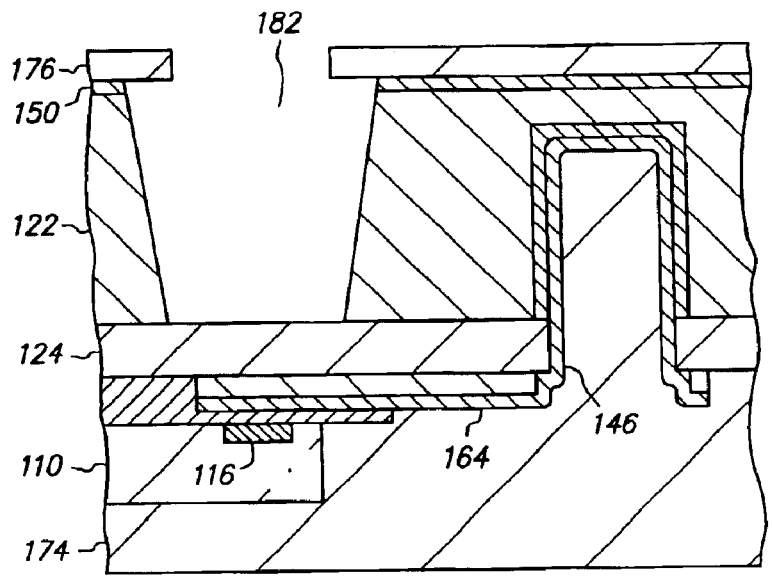
Figure 2P:
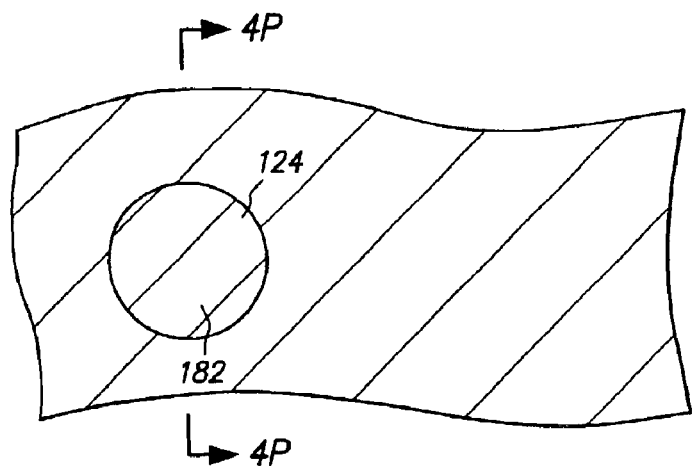
Figure 3P:
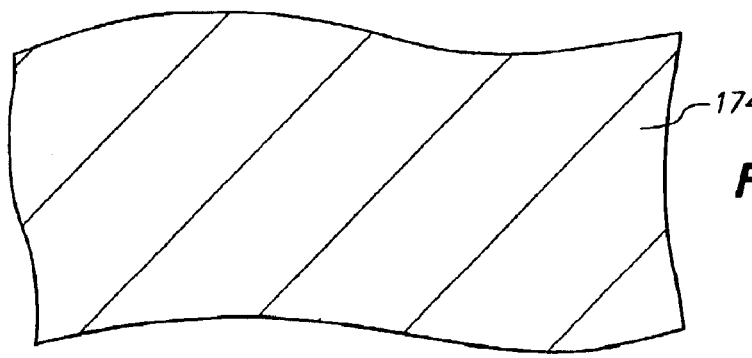
Figure 1Q:
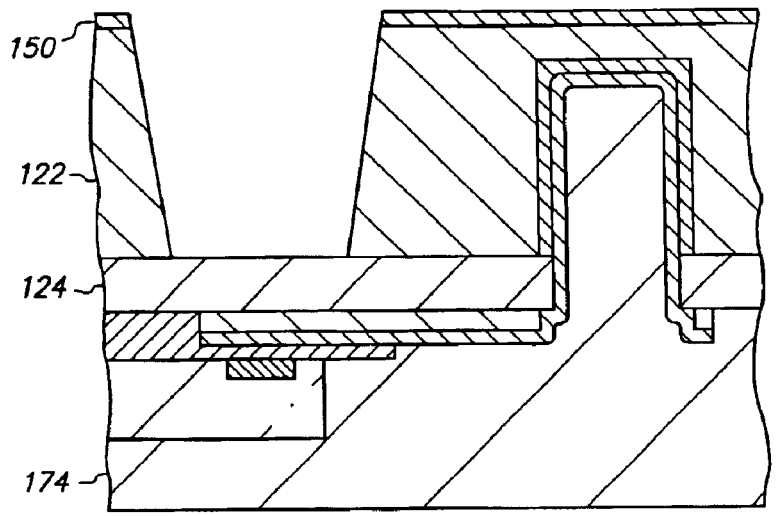
Figure 2Q:
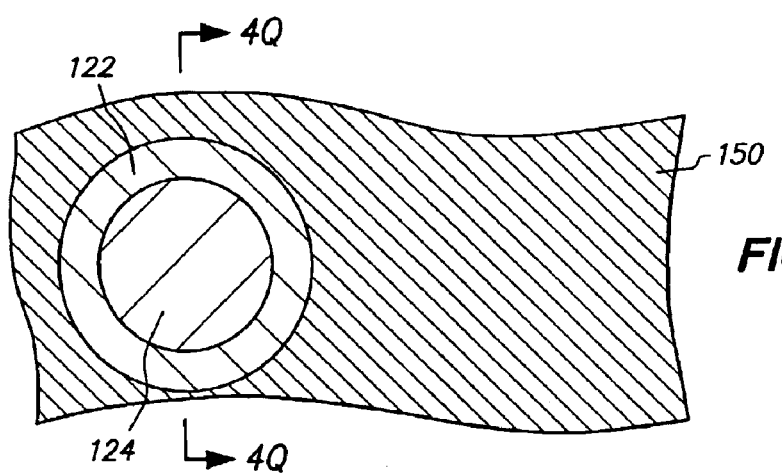
Figure 3Q:
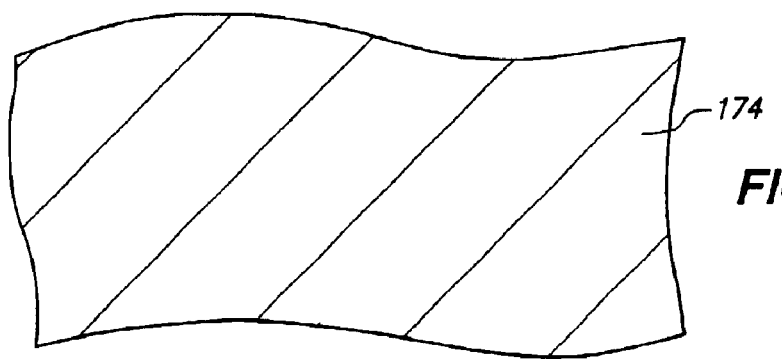
Figure 1R:
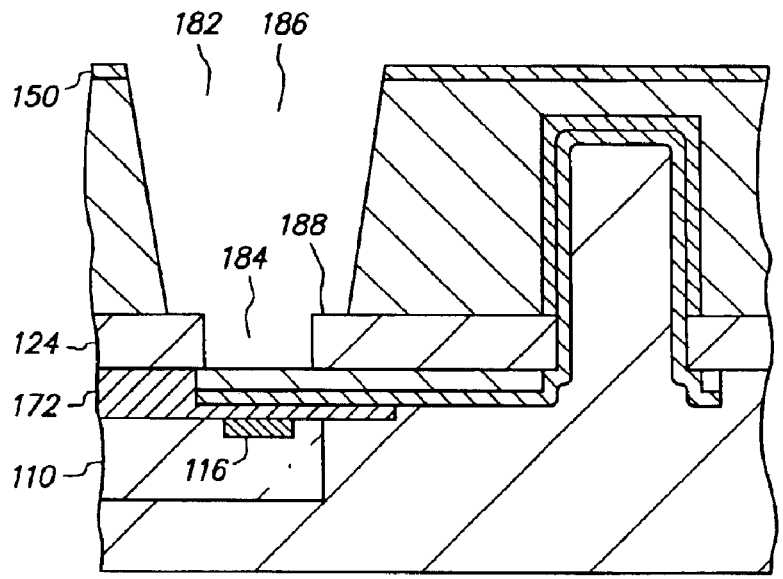
Figure 2R:
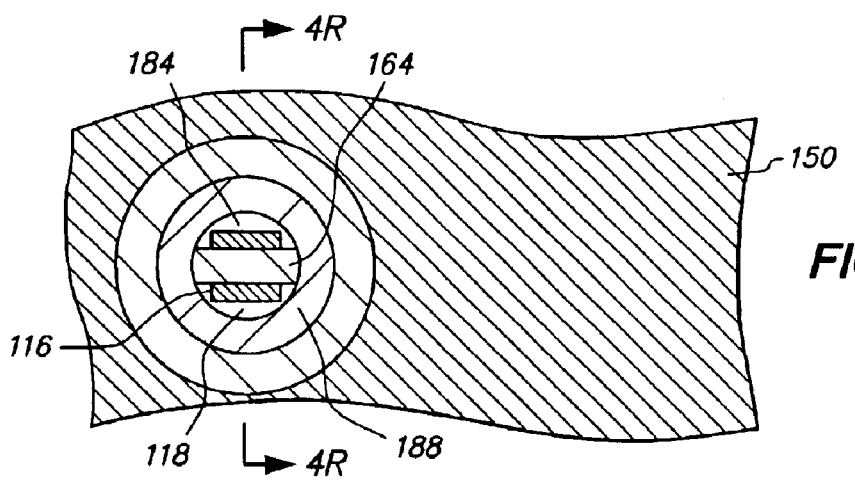
Figure 3R:
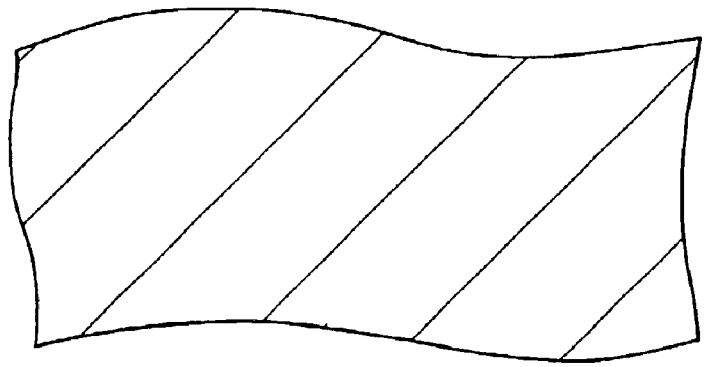
Figure 1S:
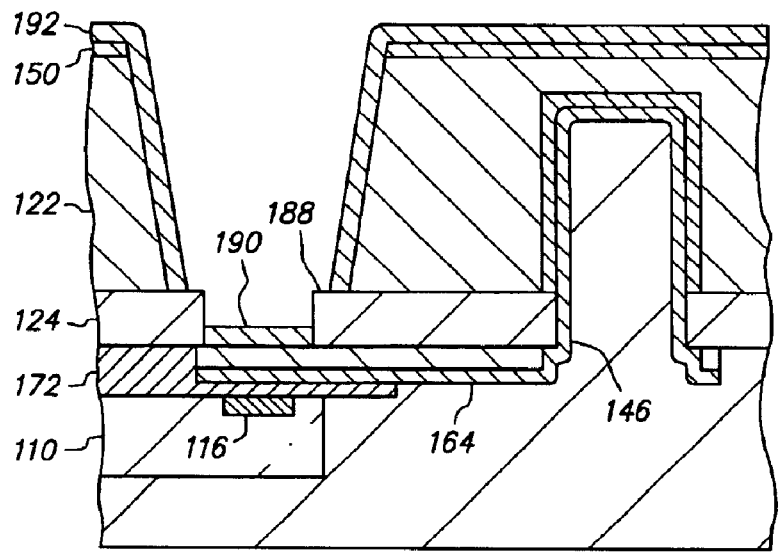
Figure 2S:
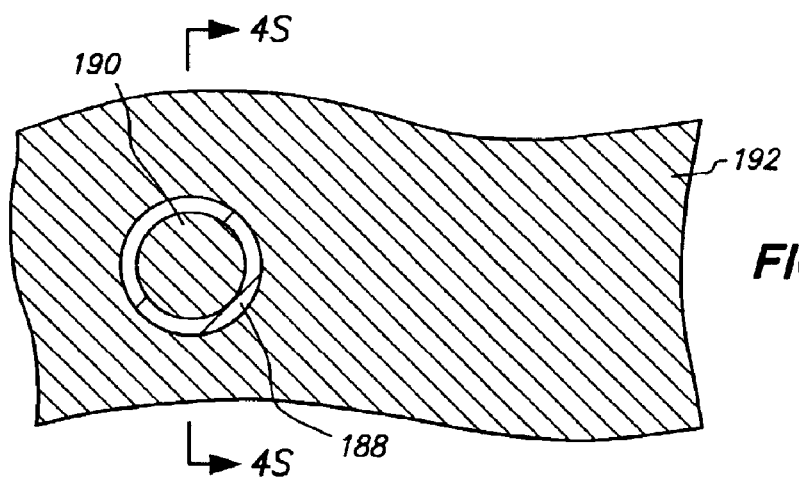
Figure 3S:
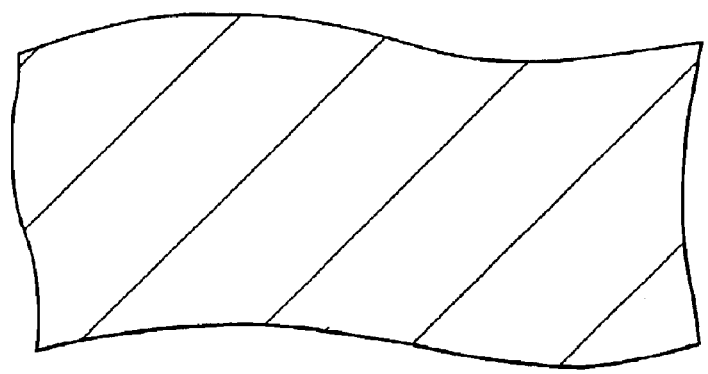
Figure 1T:
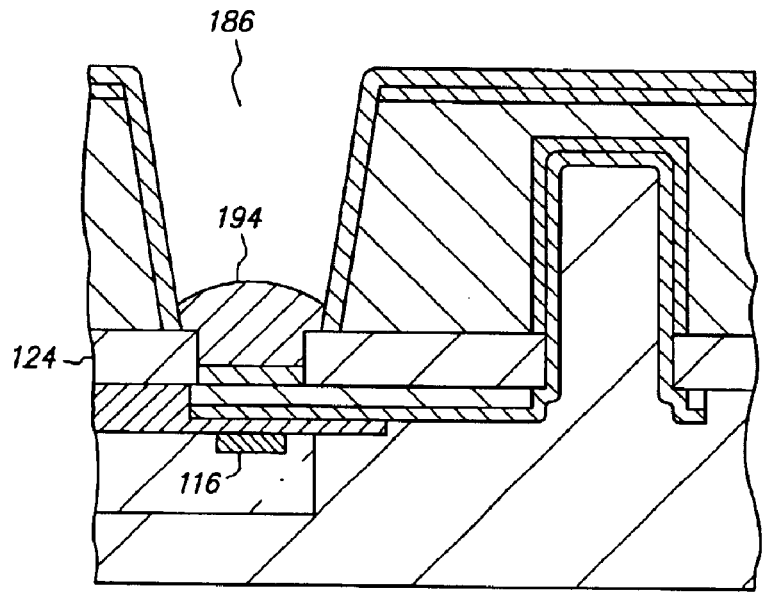
Figure 2T:
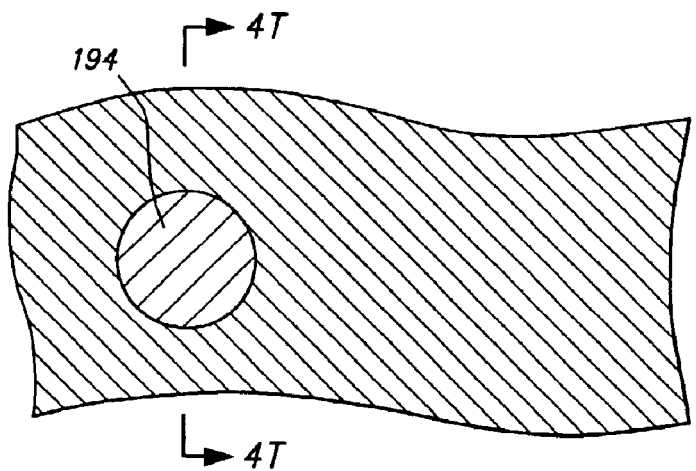
Figure 3T:
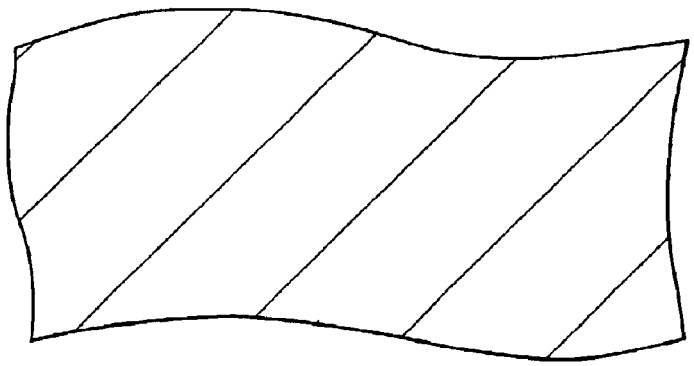
Figure 1U:
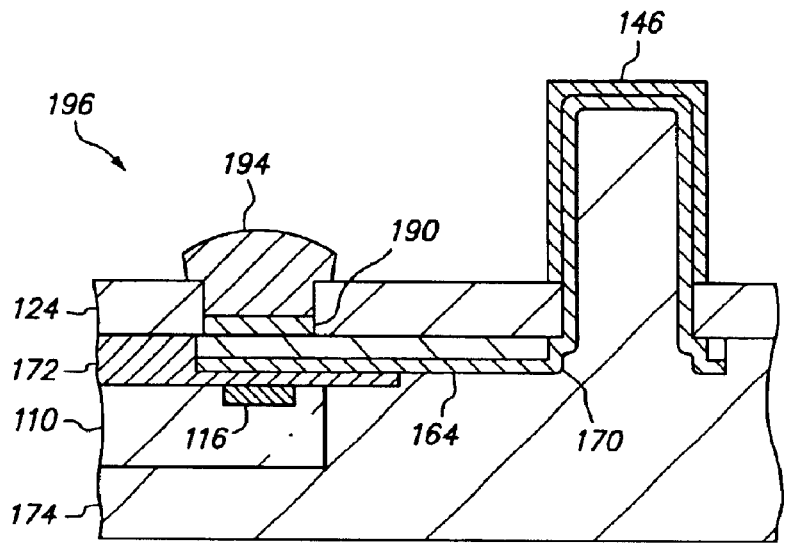
Figure 2U:
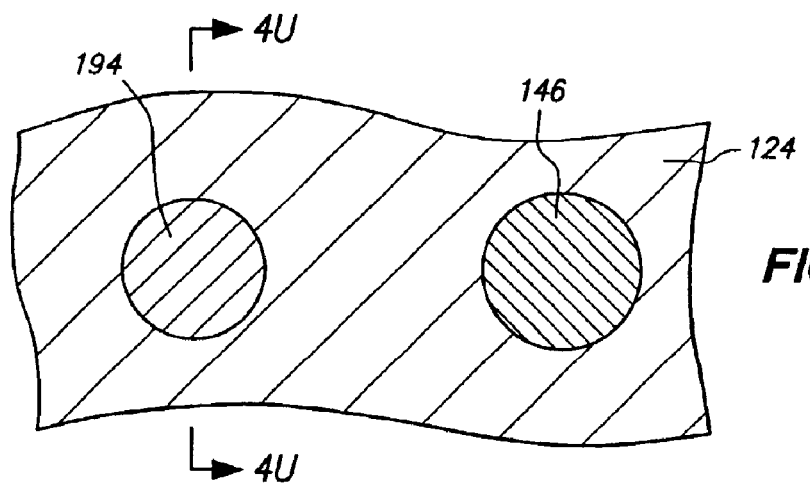
Figure 3U:
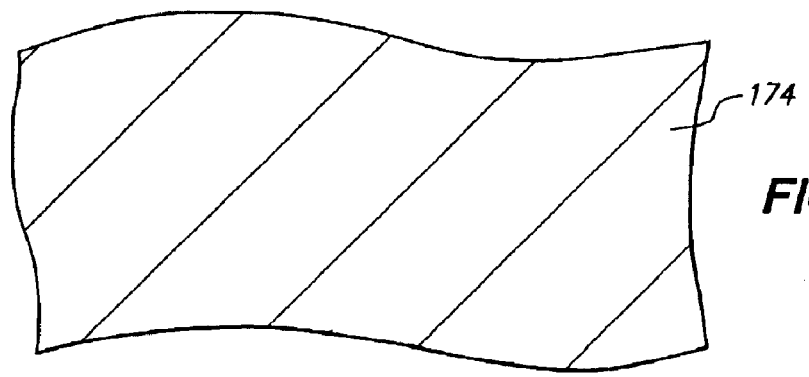

FIGS. 1C, 2C. 3C and 4C are cross-sectional, top, bottom and cross-sectional views, respectively, of masking films 134 and 136 formed on metal base 122 and metal layer 126, respectively. Masking films 134 and 136 are deposited on metal base 122 and metal layer 126, respectively, as dry films of epoxy (B stage) using a dry film lamination process in which hot rolls simultaneously press the dry films onto surfaces 130 and 132, respectively. Thereafter, the dry films are cured or hardened at a relatively low temperature in the range of 100–250° C. to form masking films 134 and 136 as solid adherent epoxy layers (C stage) with a thickness of 25 microns.

FIGS. 1D, 2D, 3D and 4D are cross-sectional, top, bottom and cross-sectional views, respectively, of via 140 formed in laminated structure 120 and masking film 136. Via 140 is a blind via formed by mechanical drilling that extends through masking film 136, metal layer 126 and insulative base 124, and into but not through metal base 122. Via 140 has a diameter of 300 microns, and extends 150 microns into metal base 122, but does not reach the remaining 50 microns of metal base 122 or masking film 134. Therefore, via 140 has a single open end at masking film 136 and is bounded by metal base 122. Via 140 has a pointed tip due to the shape of the drill bit. For convenience of illustration, the tip is not shown.

FIGS. 1E, 2E, 3E and 4E are cross-sectional, top, bottom and cross-sectional views, respectively, of recesses 142 and 144 formed in metal base 122 and metal layer 126, respectively, in via 140 by wet chemical etching using masking films 134 and 136 as etch masks. The wet chemical etch laterally etches 10 microns into metal base 122 and metal layer 126 in via 140. Thus, recesses 142 and 144 have a depth of 10 microns, and insulative base 124 laterally protrudes 10 microns from metal base 122 and metal layer 126 in via 140. The wet chemical etch also vertically etches 10 microns into metal base 122, thereby increasing the depth of via 140 in metal base 122 from 150 microns to 160 microns. A suitable wet chemical etch can be provided by a solution containing alkaline ammonia. The optimal etch time for exposing metal base 122 and metal layer 126 to the wet chemical etch in order to form recesses 142 and 144 with the desired dimensions can be established through trial and error.

FIGS. 1F, 2F, 3F and 4F are cross-sectional, top, bottom and cross-sectional views, respectively, of first contact terminal portion 146A formed on metal base 122 at recess 142. First contact terminal portion 146A includes a tin layer deposited on metal base 122, and a copper layer deposited on the tin layer. For convenience of illustration, the tin and copper layers are shown as a single layer. The tin layer is 5 microns thick, and the copper layer is 5 microns thick. As a result, first contact terminal portion 146A has a thickness of 10 microns.

First contact terminal portion 146A is formed by an electroplating operation. Thus, first contact terminal portion 146A is formed additively. Initially, metal base 122 is connected to a plating bus (not shown), current is applied to the plating bus from an external power source, and the structure is submerged in an electrolytic tin plating solution such as Technic Techni NF MTB at room temperature to electroplate the tin layer on metal base 122. Thereafter, the structure is removed from the electrolytic tin plating solution and submerged in an electrolytic copper plating solution such as SelRex CUBATH M™ at room temperature while current is applied to the plating bus to electroplate the copper layer on the tin layer. Thereafter, the structure is removed from the electrolytic copper plating, solution and rinsed in distilled water to remove contaminants.

First contact terminal portion 146A is disposed on metal base 122 at recess 142 in via 140. The tin layer contacts metal base 122, and the copper layer contacts the tin layer and is spaced from metal base 122. However, first contact terminal portion 146A does not deposit on insulative base 124 or metal layer 126. To elaborate, insulative base 124 is an electrical insulator, and therefore cannot supply current from the plating bus to generate electroplating. Metal layer 126 is not connected to the plating bus, and first contact terminal portion 146A does not extend across insulative base 124 and contact metal layer 126. Furthermore, masking film 134 prevents metal from electroplating on surface 130 of metal base 122. Masking film 136 is not needed to prevent metal from electroplating on surface 132 of metal layer 126, but protects metal layer 126 from contaminants during the dry film lamination process mentioned above.

FIGS. 1G, 2G, 3G and 4G are cross-sectional, top, bottom and cross-sectional views, respectively, of laminated structure 120 and first contact terminal portion 146A after masking films 134 and 136 are stripped. Masking films 134 and 136 are removed by being peeled off since they adhere relatively weakly to the structure and do not contain isolated segments, and the peeling off process is more economical and convenient than applying a solvent Therefore, no appreciable amount of metal base 122, insulative base 124, metal layer 126 or first contact terminal portion 146A is removed.

FIGS. 1H, 2H, 3H and 4H are cross-sectional, top, bottom and cross-sectional views, respectively, of second contact terminal portion 146B, metal layer 150 and metal layer 152 formed on the structure. Second contact terminal portion 146B is formed on insulative base 124, metal layer 126 and first contact terminal portion 146A in via 140. Metal layer 150 is formed on metal base 122 opposite via 140. Metal layer 152 is formed on metal layer 126 outside via 140. Second contact terminal portion 146B and metal layer 152 are contiguous with one another and spaced from metal layer 150.

The combination of first contact terminal portion 146A and second contact terminal portion 146B forms contact terminal 146. Contact terminal 146 includes or defines cavity 154 that faces away from metal base 122 and is exposed. Cavity 154 includes the remaining space in via 140. Thus, contact terminal 146 and cavity 154 each extend through metal layer 126 and insulative base 124, and extend into but not through metal base 122.

Second contact terminal portion 146B includes a first copper layer deposited on insulative base 124, metal layer 126 and first contact terminal portion 146A, and a second copper layer deposited on the first copper layer. Similarly, metal layer 150 includes a first copper layer deposited on surface 130 of metal base 122 and a second copper layer deposited on the first copper layer, and metal layer 152 includes a first copper layer deposited on surface 132 of metal layer 126 and a second copper layer deposited on the first copper layer. For convenience of illustration, the first and second copper layers are shown as a single layer. The first copper layers are 0.5 microns thick, and the second copper layers are 10 microns thick. As a result, second contact terminal portion 146B and metal layers 150 and 152 have a thickness of 10.5 microns.

Second contact terminal portion 146B, metal layer 150 and metal layer 152 are formed by an electroless plating operation followed by an electroplating operation.

Electroless plating provides metal deposition by an exchange reaction between metal complexes in a solution and a catalytic metal that activates or initiates the reaction. As a result, the electroless metal continually plates (i.e., deposits or grows) on the catalytic metal. The reaction does not require externally applied electric current, and therefore electroless plating can proceed without a plating bus.

Metal base 122, metal layer 126 and the exposed surface (or copper layer) of first contact terminal portion 146A are composed of copper, and therefore are catalytic to electroless copper. However, insulative base 124 is not catalytic to electroless copper. Therefore, insulative base 124 needs to be rendered catalytic to electroless copper before the electroless plating operation begins. To accomplish this, the structure is dipped in a copper activator solution such as dilute palladium chloride of approximately 0.1 grams of palladium chloride and 5 cubic centimeters of hydrochloric acid per liter of water for 10 seconds. A suitable copper activator solution is Shipley CATAPOSIT™. Palladium becomes trapped in the exposed surfaces of insulative base 124, thereby providing a nucleation layer that renders these surfaces catalytic to electroless copper.

Thereafter, the structure is removed from the copper activator solution and submerged in an electroless copper plating solution such as Shipley CUPOSIT™ 250 at 60° C and the first copper layer deposits on metal base 122, insulative base 124, metal layer 126 and first contact terminal portion 146A, thereby electrically connecting metal base 122 to metal layer 126 and assuring that all sidewall portions of via 140 are covered with plated metal.

Thereafter, the structure is removed from the electroless copper plating solution, metal base 122 is connected to a plating bus (not shown), current is applied to the plating bus from an external power source, and the structure is submerged in an electrolytic copper plating solution such as Sel-Rex CUBATH M™ at room temperature while current is applied to the plating bus to electroplate the second copper layer on the first copper layer. Thereafter, the structure is removed from the electrolytic copper plating solution and rinsed in distilled water to remove contaminants.

Advantageously, contact terminal 146 includes a tin surface layer and underlying copper layers (provided by the copper layer in first contact terminal portion 146A and the first and second copper layers in second contact terminal portion 146B). The copper layers provide an excellent electrical conductor, and the tin layer provides a wettable surface so that a solder ball (not shown) can be subsequently deposited on the contact terminal and reflowed during the next level assembly.

FIGS. 1I, 2I, 3I and 4I are cross-sectional, top, bottom and cross-sectional views, respectively, of photoresist layer 156 formed on contact terminal 146 and metal layer 152. Photoresist layer 156 is deposited in liquid form using roller coating and fills cavity 154. A reticle (not shown) is positioned proximate to photoresist layer 156 using via 140 as a registration point so that the reticle is precisely located relative to via 140. Thereafter, photoresist layer 156 is pattered by selectively applying light through the reticle, applying a developer solution to remove the photoresist portions rendered soluble by the light, and then hard baking, as is conventional. As a result, photoresist layer 156 contains opening 160 that selectively exposes portion 162 of metal layer 152. Photoresist layer 156 has a thickness of 15 microns outside via 140.

For convenience of illustration, photoresist layer 156 is shown below metal layers 126 and 152 to retain a single orientation throughout the figures for ease of comparison between the figures, although in this step the structure would be inverted so that gravitational force would assist the liquid photoresist with filling cavity 154.

FIGS. 1J, 2J, 3J and 4J are cross-sectional, top, bottom and cross-sectional views, respectively, of routing line 164 formed in metal layers 126 and 152. Routing line 164 is formed by applying a wet chemical etch to metal layers 126 and 152 using photoresist layer 156 as an etch mask. A "back-side" wet chemical etch is applied to photoresist layer 156 without being applied to the opposite or "front-side" at metal layer 150. For instance, the wet chemical etch can be sprayed on the back-side, or the front-side can be covered by a mask and then the structure can be dipped in the wet chemical etch.

The wet chemical etch etches completely through metal layers 126 and 152, thereby effecting a pattern transfer of photoresist layer 156 onto metal layers 126 and 152. The wet chemical etch is highly selective of copper with respect to polyimide, and therefore, after the wet chemical etch etches through metal layer 152 then metal layer 126 and contacts insulative base 124, no appreciable amount of insulative base 124 is removed. Thus, routing line 164 constitutes a remaining or unetched portion of metal layers 126 and 152 after the wet chemical etch is applied. Furthermore, photoresist layer 156 prevents the wet chemical etch from entering via 140 and attacking contact terminal 146.

A suitable wet chemical etch can be provided by the same solution used for etching metal base 122 and metal layer 126 to form recesses 142 and 144. The optimal etch time for exposing the structure to the wet chemical etch in order to form routing line 164 with a negligible undercut can be established through trial and error.

FIGS. 1K, 2K, 3K and 4K are cross-sectional, top, bottom and cross-sectional views, respectively, of the structure after photoresist layer 156 is stripped. Photoresist layer 156 is removed using a solvent, such as a mild alkaline solution with a pH of 9, that is highly selective of photoresist with respect to copper and polyimide. Therefore, no appreciable amount of metal base 122, insulative base 124, contact terminal 146, metal layer 150 or routing line 164 is removed. Furthermore, cavity 154 becomes exposed.

Routing line 164 includes an elongated routing region 166 with a width (orthogonal to its elongated length) of 30 microns, and an enlarged circular region 168 with a diameter of 500 microns. Contact terminal 146 is axially centered within enlarged circular region 168. Thus, contact terminal 146 has outer vertical sidewalls that are laterally spaced from the outer edges of enlarged circular region 168 by 100 microns ((500−300)/2).

The combination of contact terminal 146 and routing line 164 provides conductive trace 170 that is adapted for providing horizontal and vertical routing between pad 116 and a terminal on a printed circuit board (not shown) in a next level assembly.

FIGS. 1L, 2L, 3L and 4L are cross-sectional, top, bottom and cross-sectional views, respectively, of adhesive 172 formed on insulative base 124 and routing line 164. Adhesive 172 may include an organic surface protectant such as HK 2000 which is promptly applied to the structure after the masking films are stripped to reduce native oxide formation on the exposed copper surfaces. The use of organic surface protectant layers in insulative adhesives for semiconductor chip assemblies is well-known in the art. Thereafter, a liquid resin (A stage) such as polyamic acid is applied over a predetermined portion of the structure using stencil printing. The liquid resin flows over insulative base 124 and routing line 164. Adhesive 172 has a thickness of 30 microns as measured from insulative base 124 outside routing line 164. However, adhesive 172 does not contact metal base 122, contact terminal 146 or metal layer 150.

For convenience of illustration, adhesive 172 is shown below insulative base 124 to retain a single orientation throughout the figures for ease of comparison between the figures, although in this step the structure would be inverted so that gravitational force would assist the liquid resin flow.

FIGS. 1M, 2M, 3M and 4M are cross-sectional, top, bottom and cross-sectional views, respectively, of chip 110 mechanically attached to laminated structure 120 by adhesive 172. Adhesive 172 is disposed between and contacts chip 110 and insulative base 124, and likewise, adhesive 172 is disposed between and contacts chip 110 and routing line 164. Thus, chip 110 and insulative base 124 do not contact one another, and chip 110 and routing line 164 do not contact one another.

Chip 110 and laminated structure 120 are positioned relative to one another so that chip 110 is disposed within the surface area of adhesive 172, routing line 164 is disposed above and overlaps and is electrically isolated from pad 116, routing line 164 extends within and outside the periphery of chip 110, and contact terminal 146 is disposed outside the periphery of chip 110. Chip 110 and laminated structure 120 can be aligned using an automated pattern recognition system. Adhesive 172 is sandwiched between chip 110 and laminated structure 120 using relatively low pressure while a pick-up head that places chip 110 on-adhesive 172 is heated to a relatively low temperature such as 150° C. so that adhesive 172 is partially polymerized (B stage) and forms a gel but is not fully cured. Thereafter, adhesive 172 is heated and fully cured (C stage) at relatively low temperature in the range of 200 to 250° C. to form a solid adhesive electrically insulative thermosetting polyimide layer that mechanically fastens chip 110 to laminated structure 120. Adhesive 172 is 3 microns thick between pad 116 and routing line 164.

At this stage, insulative base 124 and contact terminal 146 are covered from above by metal base 122, routing line 164 is covered from above by insulative base 124, the portion of routing line 164 within and slightly outside the periphery of chip 110 is covered from below by adhesive 172, the portion of conductive trace 170 more than slightly outside the periphery of chip 110 is not covered from below, contact terminal 146 is not covered from below and therefore cavity 154 is exposed, pad 116 is covered from above by adhesive 172, and pad 116 is separated from routing line 164 by the thickness of adhesive 172.

FIGS. 1N, 2N, 3N and 4N are cross-sectional, top, bottom and cross-sectional views, respectively, of encapsulant 174 formed on chip 110, insulative base 124, routing line 164 and adhesive 172 by transfer molding. Transfer molding is the most popular chip encapsulation method for essentially all plastic packages. Generally speaking, transfer molding involves forming components in a dosed mold from a molding compound that is conveyed under pressure in a hot, plastic state from a central reservoir called the transfer pot through a tree-like array of runners and gates into closed cavities. Molding compounds are well-known in the art Encapsulant 174 contacts surface 114 of chip 110, the outer edges of chip 110, and surfaces of insulative base 124, contact terminal 146, routing line 164 and adhesive 172 that face towards and are outside the periphery of chip 110 without contacting metal base 122. Encapsulant 174 also extends into the remaining space in via 140 and fills cavity 154. Encapsulant 174 is a solid adherent compressible protective layer that provides backside environmental protection such as moisture resistance and particle protection for chip 110 as well as mechanical support for insulative base 124, contact terminal 146 and routing line 164 outside the periphery of chip 110. Encapsulant 174 is 100 microns thick beyond surface 114.

At this stage, adhesive 172 continues to cover pad 116, insulative base 124 and encapsulant 174 provide enhanced mechanical support for conductive trace 170, and encapsulant 174 provides protection for chip 110.

FIGS. 1O, 2O, 3O and 4O are cross-sectional, top, bottom and cross-sectional views, respectively, of photoresist layer 176 formed on metal layer 150. Photoresist layer 176 is deposited in liquid form using roller coating. Thereafter, photoresist layer 176 is patterned by selectively applying light through a reticle, applying a developer solution to remove the photoresist portions rendered soluble by the light, and then hard baking, as is conventional. As a result, photoresist layer 176 contains opening 178 that selectively exposes portion 180 of metal layer 150. Furthermore, opening 178 is axially aligned with pad 116. Photoresist layer 176 has a thickness of 15 microns.

FIGS. 1P, 2P, 3P and 4P are cross-sectional, top, bottom and cross-sectional views, respectively, of the structure after portions of metal base 122 and metal layer 150 are selectively removed to form opening 182 in metal base 122 and metal layer 150 that exposes insulative base 124. Opening 182 is formed by applying a wet chemical etch to metal base 122 and metal layer 150 using photoresist layer 176 as an etch mask. The wet chemical etch can be sprayed on metal layer 150, or the structure can be dipped in the wet chemical etch since chip 110, contact terminal 146 and routing line 164 are protected by insulative base 124 and encapsulant 174.

The wet chemical etch etches completely through metal base 122 and metal layer 150, thereby effecting a pattern transfer of photoresist layer 176 onto metal base 122 and metal layer 150. The wet chemical etch is highly selective of copper with respect to polyimide and the molding compound. Therefore, no appreciable amount of insulative base 124 or encapsulant 174 is removed.

The wet chemical etch removes portions of metal base 122 and metal layer 150 that overlap pad 116. However, the wet chemical etch does not remove the portion of metal base 122 that contacts contact terminal 146.

A suitable wet chemical etch can be provided by the same solution used for etching metal base 122 and metal layer 126 to form recesses 142 and 144. The optimal etch time for exposing the structure to the wet chemical etch in order to form opening 182 with the desired dimensions can be established through trial and error.

Opening 182 has a diameter at insulative base 124 of 200 microns, a diameter at metal layer 150 of 300 microns, and tapered sidewalls therebetween that slant inwardly as the vertical distance from the open end increases due to the isotropic nature of the wet chemical etch. Thus, opening 182 has a diameter between 200–300 microns, and pad 116 (with a length and width of 70 microns) is centered within and axially aligned with opening 182. Furthermore, opening 182 is spaced from contact terminal 146.

FIGS. 1Q, 2Q, 3Q and 4Q are cross-sectional, top, bottom and cross-sectional views, respectively, of the structure after photoresist layer 176 is stripped. Photoresist layer 17B is removed using a solvent, such as a mild alkaline solution with a pH of 9, that is highly selective of photoresist with respect to copper, polyimide and the molding compound. Therefore, no appreciable amount of metal base 122, insulative base 124, metal layer 150 or encapsulant 174 is removed.

FIGS. 1R, 2R, 3R and 4R are cross-sectional, top, bottom and cross-sectional views, respectively, of the structure after portions of insulative base 124 and adhesive 172 are selectively removed to form opening 184 in insulative base 124 and adhesive 172. The combination of openings 182 and 184 form opening 186 that exposes pad 116 and routing line 164.

Opening 184 is formed by applying a suitable etch that is highly selective of insulative base 124 and adhesive 172 with respect to pad 116 and routing line 164. In this instance, a selective TEA $CO_2$ laser etch is applied. The laser is directed into opening 182, aimed at pad 116 and ablates insulative base 124 and adhesive 172. The laser removes portions of insulative base 124 above routing line 164 and removes portions of insulative base 124 and adhesive 172 above pad 116 and outside routing line 164. However, the laser does not remove annular region 188 of insulative base 124 between metal base 122 and opening 184. Thus, annular region 188 forms a ledge beneath opening 182.

Opening 184 has a diameter of 80 microns and is centered within and axially aligned with opening 182. Furthermore, pad 116 (with a length and width of 70 microns) is centered within and axially aligned with opening 184. Routing line 164 shields the underlying adhesive 172 from the laser etch so that the portion of adhesive 172 sandwiched between routing line 164 and pad 116 remains intact. Opening 184 is formed in insulative base 124 and adhesive 172 without damaging pad 116, passivation layer 118 or routing line 164.

Opening 186 extends through laminated structure 120, metal layer 150 and adhesive 172, but does not extend into chip 110.

Thereafter, a brief oxygen plasma cleaning step can be applied to clean routing line 164 in opening 186. The use of oxygen plasmas to clean copper surfaces in semiconductor chip assemblies is wellknown in the art.

FIGS. 1S, 2S, 3S and 4S are cross-sectional, top, bottom and cross-sectional views, respectively, of connection joint 190 formed on pad 116 and routing line 164, and metal layer 192 formed on metal base 122 and metal layer 150.

Connection joint 190 and metal layer 192 are formed by an electroplating operation. Initially, metal base 122 is connected to a plating bus (not shown), current is applied to the plating bus from an external power source, and the structure is submerged in an electrolytic copper plating solution such as Sel-Rex CUBATH M™ at room temperature while current is applied to the plating bus. As a result, metal layer 192 electroplates on the exposed portions of metal base 122 (inside opening 182) and metal layer 150 (inside and outside opening 182). In addition, since the plating bus provides the current to metal base 122, which provides the current to contact terminal 146, which in turn provides the current to routing line 164, connection joint 190 electroplates on the exposed portions of routing line 164 in opening 184. At the initial stage, since adhesive 172 is an electrical insulator and pad 116 is not connected to the plating bus, connection joint 190 does not electroplate on pad 116 and is spaced from pad 116. However, as the copper electroplating continues, connection joint 190 continues to plate on routing line 164, extends through adhesive 172 and contacts pad 116. As a result, pad 116 is connected to the plating bus via metal base 122, contact terminal 146, routing line 164 and connection joint 190, and therefore connection joint 190 begins to electroplate on pad 116 as well. The copper electroplating continues until connection joint 190 has the desired thickness. Thereafter, the structure is removed from the electrolytic copper plating solution and rinsed in distilled water to remove contaminants.

Connection joint 190 is formed in opening 186 and contacts and electrically connects pad 116 and routing line 164. Connection joint 190 contacts and rovers portions of pad 116 beneath opening 186 and outside routing line 164, the surface of routing line 164 that overlaps and faces away from pad 116, and the outer edges (or peripheral sidewalls) of routing line 164 that overlap and are orthogonal to pad 116. Thus, connection joint 190 provides a robust, permanent electrical connection between pad 116 and routing line 164.

Connection joint 190 is the only electrical conductor external to chip 110 that contacts pad 116, adhesive 172 and connection joint 190 are the only materials external to chip 110 that contact pad 116, and adhesive 172 and connection joint 190 are the only materials that contact both pad 116 and routing line 164.

Connection joint 190 and metal layer 192 are composed of copper and remain spaced and separated from one another. That is, the copper electroplating operation is discontinued before connection joint 190 and metal layer 192 become thick enough to contact one another in opening 186. Furthermore, a portion of annual region 188 of insulative base 124 beneath the gap between connection joint 190 and metal layer 192 remains exposed.

FIGS. 1T, 2T, 3T and 4T are cross-sectional, top, bottom and cross-sectional views, respectively, of insulator 194 formed on insulative base 124 and connection joint 190 in opening 186.

Preferably, insulator 194 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited into opening 186 using stencil printing, then the epoxy paste is cured or hardened at a relatively low temperature in the range of 100–250° C. to form a solid adherent insulator that provides a protective seal for connection joint 190.

FIGS. 1U, 2U, 3U and 4U are cross-sectional, top, bottom and cross-sectional views, respectively, of the structure after metal base 122 and metal layers 150 and 192 are removed by wet chemical etching. The wet chemical etch can be sprayed on metal layer 192, or the structure can be dipped in the wet chemical etch since chip 110 and routing line 164 are protected by insulative base 124 and encapsulant 174. A suitable wet chemical etch can be provided by the same solution used for etching metal base 122 and metal layer 126 to form recesses 142 and 144. A solution containing alkaline ammonia is generally preferred due to the tin surface layer of contact terminal 146. The wet chemical etch is highly selective of copper with respect to tin, polyimide, epoxy and the molding compound. Therefore, no appreciable amount of insulative base 124, contact terminal 146, encapsulant 174 or insulator 194 is removed. The optimal etch time for exposing the structure to the wet chemical etch in order to completely remove all remaining portions of metal base 122, metal layer 150 and metal layer 192 without excessively exposing the tin surface layer of contact terminal 148 to the wet chemical etch can be established through trial and error.

The wet chemical etch removes the portion of metal base 122 that contacts the tin surface layer of contact terminal 146. As a result, the tin surface layer of contact terminal 146 protrudes from insulative base 124 in the direction away from chip 110 and is fully exposed. Likewise, the wet chemical etch removes the portion of metal base 122 that contacts a portion of the side of insulative base 124 that faces away from chip 110 that surrounds and is adjacent to and outside the periphery of contact terminal 146.

Advantageously, since the wet chemical etch is not selective of insulative base 124, the tin surface layer of contact terminal 146, encapsulant 174 or insulator 194, there is a wide window of acceptable etch times and little or no endpoint concern. Another advantage is that metal base 122 and metal layers 150 and 192 are composed of copper, and therefore the removal can be provided by a single wet chemical etch step using a copper etching solution. Another advantage is that insulative base 124 and encapsulant 174 provide mechanical support for contact terminal 146, and therefore reduce the mechanical strain on adhesive 172. The enhanced mechanical strength is particularly useful after metal base 122 is removed. A further advantage is that contact terminal 146 extends from insulative base 124 into but not beyond metal base 122, and therefore does not provide an etch mask for metal base 122.

A still further advantage is that insulative base 124 protects conductive trace 170 from chemical and mechanical damage by the wet chemical etch and subsequent cleaning steps (such as rinsing in distilled water and air blowing). For instance, insulative base 124 protects routing line 164 from chemical attack by the wet chemical etch, protects routing line 164 from the physical force of the wet chemical etch and cleaning steps that might otherwise cause routing line 164 to separate from adhesive 172, and protects the lower portion of contact terminal 146 from the physical force of the wet chemical etch and cleaning steps that might otherwise cause contact terminal 146 to separate from routing line 164. Accordingly, insulative base 124 improves the structural integrity and allows the wet chemical etch and subsequent cleaning steps to be applied more vigorously, thereby improving manufacturing throughout.

Yet a further advantage is that since insulative base 124 protrudes into via 140 due to recesses 142 and 144, the tin surface layer of contact terminal 146 contacts the major surface of insulative base 124 that faces towards metal base 122, thereby providing a seal that prevents the wet chemical etching solution from seeping into via 140 and attacking the copper layers of contact terminal 146. In other words, if recesses 142 and 144 were absent, then no appreciable amount of the tin surface layer would contact insulative base 124 at the interface between metal base 122 and insulative base 124 in via 140, and the wet chemical etch that removes the portion of metal base 122 that contacts contact terminal 146 might seep between insulative base 124 and the tin surface layer, attack the copper layers of contact terminal 146 and possibly deteriorate or severe contact terminal 146 in via 140.

Yet another advantage is that the compressibility of encapsulant 174 permits contact terminal 146 to provide a compressible, compliant contact terminal. That is, contact terminal 146 exhibits elastic deformation in response to external pressure. As a result, contact terminal 146 provides excellent compliance for the next level assembly.

Still another advantage is that insulator 194 protects connection joint 190 from the wet chemical etch, thereby permitting connection joint 190 to be copper.

At this stage, the manufacture of semiconductor chip assembly 196 that includes chip 110, insulative base 124, conductive trace 170, adhesive 172, encapsulant 174, connection joint 190 and insulator 194 can be considered complete. Conductive trace 170 is mechanically coupled to chip 110 by adhesive 172, and is electrically coupled to chip 110 by connection joint 190. Conductive trace 170 extends beyond an outer edge of chip 110 and provides horizontal fan-out routing (via routing line 164) and vertical routing (via contact terminal 146) between pad 116 and external circuitry. Insulative base 124, encapsulant 174 and insulator 194 provide mechanical support and environmental protection for the assembly. Moreover, insulative base 124 protects routing line 164 from unwanted solder reflow during the next level assembly.

The semiconductor chip assembly includes other conductive traces embedded in insulative base 124 and adhesive 172, and only a single conductive trace 170 is shown for convenience of illustration. The conductive traces are each connected to a respective pad on chip 110 by a respective connection joint. Furthermore, the conductive traces each extend horizontally from their respective pads and contain a contact terminal at a distal end outside the periphery of chip 110 to provide horizontal fan-out routing and vertical routing for their respective pads. The contact terminals are the only electrical conductors that extend to the surface of insulative base 124 that faces away from chip 110. Thus, all horizontal routing for the pads that is external to chip 110 occurs at the routing lines between insulative base 124 and chip 110.

The conductive traces are electrically isolated from one another by insulative base 124 and adhesive 172 after metal base 122 is removed. To elaborate, chip 110 is designed with the pads electrically isolated from one another. However, the pads are electrically connected to one another through the connection joints, the routing lines, the contact terminals and metal base 122 before metal base 122 is removed. Thereafter, metal base 122 is etched and removed to expose the contact terminals, which are spaced and separated from one another, and since metal base 122 no longer electrically connects the contact terminals to one another, the conductive traces are electrically isolated from one another and the pads are electrically isolated from one another.

Advantageously, there is no plating bus or related circuitry that need be disconnected or severed from chip 110 or the conductive traces after metal base 122 is removed and the connection joints are formed. If desired, solder paste can be screen printed on the tops of the contact terminals to provide connections to the next level assembly.

The semiconductor chip assembly described above is merely exemplary. Numerous other embodiments are contemplated.

Figure 5:
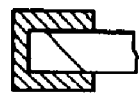
FIGS. 5–9 are top plan views of routing line variations in accordance with the present invention.
Figure 6:
Figure 7:
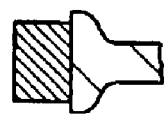
Figure 8:
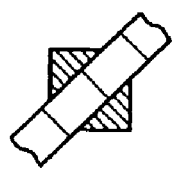
Figure 9:
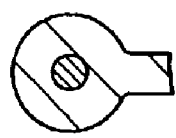

The conductive trace can have various shapes and sizes. The conductive trace can overlap various portions of the pad, such as two opposing peripheral edges and the center of the pad (FIG. 2R), one peripheral edge and the center of the pad (FIG. 5), three peripheral edges but not the center of the pad (FIGS. 6 and 7), two corners and the center of the pad (FIG. 8) or four peripheral edges but not the center of the pad (FIG. 9).

The conductive trace can be various conductive metals including copper, gold, nickel, silver, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. Likewise, the conductive trace can fan-in or fan-out or both, regardless of whether it includes a contact terminal.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. Resin-coated copper foil (RCC) laminates are also suitable. However, other laminated structures can also be employed.

The metal base and the metal layer can be various metals such as copper, gold, nickel, silver, palladium, tn, combinations thereof, and alloys, and need not necessarily have the same composition.

The metal base and the metal layer can each be a single layer or multiple layers. If desired, the metal layer (or routing line) can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. As another example, the metal layer can include a non-copper layer between a copper layer and the insulative base. Suitable non-copper layers include nickel, gold, palladium and silver. A gold layer is wellsuited for receiving a gold ball bond connection joint.

The metal base need not necessarily be removed. For instance, a portion of the metal base above the pad can be selectively etched to permit formation of the opening in the insulative base and the adhesive, another portion of the metal base that contacts the contact terminal can be selectively etched so that the contact terminal is electrically isolated from the metal base, and another portion of the metal base that is disposed within the periphery of the chip can remain intact and provide a heat sink.

The opening in the metal base can be formed before or after the routing line is formed, before or after the opening in the insulative base and the adhesive is formed, and before or after mechanically attaching the conductive trace to the chip. For instance, the opening in the metal base can be formed, then the conductive trace can be mechanically attached to the chip, and then the opening in the insulative base and the adhesive can be formed, thereby exposing the routing line and the pad through the combined opening that extends through the metal base, the insulative base and the adhesive. The opening in the metal base can be formed by various techniques including mechanical drilling, mechanical punching, laser drilling and wet chemical etching. In addition, the opening in the metal base can be formed by selectively etching the metal base through an etch mask or by blankety etching a recess in the metal base. Furthermore, the opening in the metal base can expose a single pad or a plurality of pads. For instance, the opening in the metal base can expose multiple openings in the insulative base and the adhesive which each expose a respective routing line and a respective pad, thereby facilitating the flow of electrolytic plating solution for the connection joints. Thereafter, multiple connection joints can be formed which each contact and electrically connect a respective routing line and a respective pad, a single-piece insulator can be formed in the opening in the metal base and on the insulative base and the connection joints, and then the metal base can be etched to expose the contact terminal while the insulator protects the connection joints from the wet chemical etch.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wisconsin are suitable.

The insulative base may be disposed between the metal base and the metal layer in numerous manners. For instance, an epoxy resin without reinforcement can be coated onto the metal base and then laminated to the metal layer as heat and pressure are applied. Alternatively, a prepreg with reinforcement can be a dry film that is sandwiched between the metal base and the metal layer and then laminated to the metal base and the metal layer as heat and pressure are applied.

The via can be formed in numerous manners. For instance, the via can be formed with a single removal step such as mechanical drilling, mechanical punching or laser drilling. Alternatively, the via can be formed with multiple removal steps. For example, a first masking film can be deposited on the metal base, a second masking film can be deposited on the metal layer, and the via can be formed through the second masking film using laser drilling, then through the metal layer using wet chemical etching, then through the insulative base using laser drilling, then into but not through the metal base using wet chemical etching. As another example, the via can be formed through the metal layer using wet chemical etching, then through the insulative base using plasma etching, then into but not through the metal base using wet chemical etching.

The via can be formed with numerous configurations. For instance, the via can extend through the metal base, the insulative base and the metal layer. Alternatively, the via can extend through the metal layer and the insulative base and extend into but not through the metal base. Likewise, the via may reach but not extend into, extend into but not through, or extend through the metal base or the metal layer.

The contact terminal is particularly well-suited for interconnecting to the next level assembly. The contact terminal need not necessarily extend above the insulative base, and a ball, pad or pillar (columnar post) can be subsequently deposited on the contact terminal. Likewise, the contact terminal can be disposed within or outside the periphery of the chip. For instance, if the contact terminal is disposed within the periphery of the chip, then the adhesive which mechanically attaches the laminated structure to the chip can fill the cavity.

The contact terminal can be formed with numerous techniques and materials. For instance, the contact terminal can be formed by electrolessly plating a tin layer on the metal layer, the insulative base and the metal base in the via, and then electroplating a copper layer on the tin layer. As another example, the contact terminal can include an electroplated tin surface layer. These approaches provide a tin-coated contact terminal that is well-suited for a tin reflow operation in a lead-free environment during the next level assembly, or alternatively, a solder reflow operation during the next level assembly in which solder paste is deposited on the contact terminal after the metal base is removed. Likewise, the contact terminal can include a gold, silver or palladium surface layer that is well-suited for a solder reflow operation during the next level assembly. As another example, the contact terminal can include a solder surface layer. This provides a solder-coated contact terminal that is well-suited for a solder reflow operation during the next level assembly. Further details regarding a contact terminal formed in a laminated structure are disclosed in U.S. application Ser. No. 10/165,483 filed Jun. 6, 2002 by Charles W. C. Lin et al. entitled "Method of Making a Contact Terminal with a Plated Metal Peripheral Sidewall Portion for a Semiconductor Chip Assembly" which is incorporated by reference.

The routing line can be formed in numerous manners. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. For example, the metal layer can be an ultrathin copper foil with a thickness of 1–3microns that is attached to an aluminum layer, then the metal layer can be laminated to the insulative base and sandwiched between the aluminum layer and the insulative base, then the aluminum layer can be peeled off the metal layer, the plated metal can be electroplated copper with a thickness of 10–15 microns, and a copper etching solution can be briefly applied to etch completely through the metal layer and remove a few microns of the plated metal. In this manner, the routing line can be formed semi-additively and composed of copper and include unetched portions of the metal layer and the plated metal. Likewise, the routing line can be formed subtractively from the metal layer, regardless of whether the plated metal etch mask remains attached to the routing line. Furthermore, the plated metal can provide a layer for the contact terminal.

The routing line can be formed at various stages. For instance, a photoresist layer can be formed over the metal layer before or after the via is formed, and before or after the contact terminal is formed. Similarly, the metal layer can be etched using the photoresist layer as an etch mask to form the routing line before or after the via is formed, and before or after the contact terminal is formed. Similarly, the photoresist layer can be stripped before or after the via is formed, and before or after the contact terminal is formed. Preferably, the photoresist layer is not present when the contact terminal is formed.

The pad can have numerous shapes including a flat rectangular shape and a bumped shape. For instance, a bump-shaped pad may extend into the opening in the insulative base and the adhesive and may even extend above the routing line. The pad can either be partially or completely exposed prior to forming the connection joint The pad can have a length and width that are larger than, equal to, or smaller than the diameter of the opening. Preferably, the pad and opening have the same or similar size, and a substantial portion of the pad is directly beneath the opening. If desired, the pad can be treated to accommodate the connection joint. For instance, the pad can be rendered catalytic to an electroless nickel connection joint by depositing several metal layers, such as chromium/copper/gold or titanium/nickel/gold on the aluminum base, or alternatively, zincating the aluminum base and electrolessly plating a nickel surface layer on the zincated aluminum base.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may contact the insulative base, whereas if a laminated adhesive is applied then no appreciable amount of adhesive may contact the insulative base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Furthermore, silicone adhesives are particularly well-suited if the adhesive is used to fill the cavity.

The opening in the insulative base and the adhesive may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the opening in the insulative base and the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the opening in the insulative base and the adhesive.

The opening in the insulative base and the adhesive can be formed with numerous etching techniques. For instance, the opening can be formed by laser ablation (including laser direct write without a mask and projection laser ablation with a mask), plasma etching (including blanket plasma etching without a mask or plasma etching with a mask) or combinations thereof. In addition, the opening can have a circular, ovular, square, rectangular or other shape (as viewed from the top surface of the insulative base). The opening may be aligned with and expose a single pad or a plurality of pads. Likewise, the opening may expose one or more peripheral edges of the pad or just a central portion of the pad spaced from the peripheral edges of the pad. Furthermore, the opening sidewalls may have a wide variety of shapes and slopes including vertical sidewalls, tapered sidewalls, continuous sidewalls and stepped sidewalls.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip. For instance, a glob-top coating can be deposited on the chip after mechanically attaching the chip to the laminated structure, and then the encapsulant can be formed on the glob-top coating.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing, conductive adhesive curing, and welding, and can have a wide variety of shapes and sizes. The shape and composition of the connection joint depends on the composition of the routing line and the contact terminal as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the connection joint is formed, further encapsulation can be performed but is generally not necessary. However, it may be desirable to provide further encapsulation to enhance the mechanical strength of the assembly in the event the encapsulant and/or insulative base are particularly thin or omitted. Likewise, further encapsulation can be used to cover the connection joint if the insulator is omitted.

After the connection joint is formed, a soldering material or solder ball can be deposited over the contact terminal by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly. Moreover, the contact terminal can be formed with a solder surface layer, thereby rendering additional soldering material unnecessary. That is, the contact terminal itself can be reflowed to provide a solder joint for electrical connection with the next level assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Similarly, the plating bus can be disconnected by removing the portion of the metal base that contacts the contact terminal.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted, rotated or slanted. Likewise, the routing line is shown above the chip, the insulative base is shown above the routing line, and the metal base is shown above the insulative base with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The insulative base and the encapsulant protect the chip from handling damage and provide a known dielectric barrier for the conductive trace. The insulative base and the encapsulant also provide critical mechanical support for the conductive trace during and after the metal base removal. The insulative base prevents solder reflow from electrically shorting the underlying routing line. The contact terminal yields enhanced reliability for the next level assembly. The contact terminal can also exhibit compliance and flexibility for the next level assembly. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of connecting a conductive trace and an insulative base to a semiconductor chip, comprising:

providing a semiconductor chip, a metal base, an insulative base and a conductive trace, wherein the chip includes a conductive pad, the metal base is disposed on a side of the insulative base that faces away from the chip, and the conductive trace includes a contact terminal that extends through the insulative base; then exposing the pad through an opening that extends through the metal base and the insulative base and is spaced from the contact terminal; then forming a connection joint that contacts and electrically connects the conductive trace and the pad; and then removing a portion of the metal base that contacts the contact terminal, thereby electrically isolating the pad from other conductive pads of the chip.

2. The method of claim 1, including mechanically attaching the chip to the conductive trace using an insulative adhesive before forming the opening.

3. The method of claim 2, including forming the opening through the adhesive.

4. The method of claim 3, wherein the adhesive contacts and is sandwiched between the conductive trace and the pad, and the conductive trace and the pad are electrically isolated from one another after forming the opening and before forming the connection joint.

5. The method of claim 3, including attaching the conductive trace to the insulative base before attaching the chip to the conductive trace.

6. The method of claim 3, wherein forming the opening includes applying a wet chemical etch to the metal base and then applying a laser that ablates the insulative base and the adhesive.

7. The method of claim 1, including:

providing a laminated structure that includes the metal base, the insulative base and the conductive trace; then mechanically attaching the laminated structure to the chip; then removing a portion of the insulative base that overlaps the pad; then forming the connection joint; and then etching the metal base to remove the portion of the metal base that contacts the contact terminal.

8. The method of claim 1, including depositing an insulator into the opening and on the insulative base and the connection joint before removing the portion of the metal base.

9. The method of claim 1, wherein the metal base and the connection joint are copper.

10. The method of claim 1, wherein the connection joint is devoid of wire bonds, TAB leads and solder joints.

11. A method of connecting a conductive trace and an insulative base to a semiconductor chip, comprising:

providing a semiconductor chip that includes a conductive pad;

providing a laminated structure that includes a conductive trace, an insulative base and a metal base, wherein the conductive trace includes a contact terminal and a routing line, and the contact terminal extends through the insulative base and into the metal base; then disposing an insulative adhesive between the chip and the laminated structure, thereby mechanically attaching the chip to the laminated structure such that the metal base is disposed on a side of the insulative base that faces away from the chip, and the routing line is disposed on a side of the insulative base that faces towards the chip; then exposing the routing line and the pad through an opening that extends through the metal base, the insulative base and the adhesive and is spaced from the contact terminal; then forming a connection joint that contacts and electrically connects the routing line and the pad; and then removing a portion of the metal base that contacts the contact terminal, thereby electrically isolating the pad from other conductive pads of the chip.

12. The method of claim 11, wherein the routing line overlaps only one peripheral edge of the pad.

13. The method of claim 11, wherein the routing line overlaps only two peripheral edges of the pad, and the two peripheral edges are opposite one another.

14. The method of claim 11, wherein the routing line overlaps at least one peripheral edge of the pad and overlaps a center of the pad but does not overlap each peripheral edge of the pad.

15. The method of claim 11, wherein forming the opening includes applying a wet chemical etch that removes a portion of the metal base.

16. The method of claim 11, wherein forming the opening includes applying a laser that ablates the insulative base and the adhesive.

17. The method of claim 11, wherein forming the opening includes applying a wet chemical etch that removes a portion of the metal base and then applying a laser that ablates the insulative base and the adhesive.

18. The method of claim 11, wherein the removing the portion of the metal base exposes a distal end of the contact terminal that faces away from the chip.

19. The method of claim 11, wherein the removing the portion of the metal base removes all remaining portions of the metal base.

20. The method of claim 11, wherein the connection joint contacts a surface of the routing line that is disposed above and overlaps and faces away from the pad.

21. The method of claim 11, wherein the connection joint contacts opposing peripheral sidewalls of the routing line that are disposed above and overlap and are orthogonal to the pad.

22. The method of claim 11, wherein the connection joint is the only electrical conductor external to the chip that contacts the pad.

23. The method of claim 11, wherein the connection joint and the adhesive are the only materials external to the chip that contact the pad.

24. The method of claim 11, wherein the connection joint and the adhesive are the only materials that contact both the conductive trace and the pad.

25. The method of claim 11, wherein the connection joint is formed by electroplating.

26. The method of claim 11, wherein the routing line overlaps the pad and extends within and outside a periphery of the chip, and the contact terminal is disposed outside the periphery of the chip.

27. The method of claim 11, wherein the adhesive extends through the insulative base and into the metal base inside the contact terminal.

28. The method of claim 11, including forming an encapsulant on the chip after attaching the chip to the laminated structure and before forming the opening, wherein the encapsulant extends through the insulative base and into the metal base inside the contact terminal.

29. The method of claim 11, wherein the contact terminal is the only electrical conductor that is electrically connected to the pad and extends to the side of the insulative base that faces away from the chip.

30. The method of claim 11, wherein the connection joint is devoid of wire bonds, TAB leads and solder joints.

31. A method of connecting a conductive trace and an insulative base to a semiconductor chip, comprising the following steps in the sequence set forth:

providing a laminated structure that includes a conductive trace, an insulative base and a metal base, wherein the conductive trace includes a routing line and a contact terminal, the metal base and the routing line are disposed on opposite sides of the insulative base, and the contact terminal extends through the insulative base and into the metal base;

disposing an insulative adhesive between a chip and the laminated structure, thereby mechanically attaching the chip to the laminated structure, wherein the chip includes a conductive pad, the metal base is disposed on a side of the insulative base that faces away from the chip, and the routing line is disposed on a side of the insulative base that faces towards the chip;

exposing the routing line and the pad through an opening that extends through the metal base, the insulative base and the adhesive and is spaced from the contact terminal;

forming a connection joint that contacts and electrically connects the routing line and the pad; and removing a portion of the metal base that contacts the contact terminal, thereby electrically isolating the pad from other conductive pads of the chip.

32. The method of claim 31, wherein forming the conductive trace includes forming the routing line subtractively and forming the contact terminal additively.

33. The method of claim 31, wherein forming the routing line includes:

providing a metal layer in contact with the insulative base;

forming a photoresist layer;

etching the metal layer using the photoresist layer as an etch mask; and removing the photoresist layer.

34. The method of claim 31, wherein forming the contact terminal includes:

providing a metal layer in contact with the insulative base, wherein the metal base and the metal layer are disposed on opposite sides of the insulative base;

forming a via that extends through the metal layer and the insulative base and into but not through the metal base; and depositing the contact terminal into the via, wherein the contact terminal extends through the metal layer and the insulative base and into but not through the metal base.

35. The method of claim 31, wherein forming the contact terminal includes:

providing a metal layer in contact with the insulative base, wherein the metal base and the metal layer are disposed on opposite sides of the insulative base;

forming a via that extends through the metal layer, the insulative base and the metal base; and depositing the contact terminal into the via, wherein the contact terminal extends through the metal layer, the insulative base and the metal base.

36. The method of claim 31, wherein the adhesive extends through the routing line and the insulative base and into the metal base inside the contact terminal.

37. The method of claim 31, including forming an encapsulant on the chip after attaching the chip to the laminated structure and before forming the opening, wherein the encapsulant extends through the routing line and the insulative base and into the metal base inside the contact terminal.

38. The method of claim 31, wherein the routing line overlaps only one peripheral edge of the pad.

39. The method of claim 31, wherein the routing line overlaps only two peripheral edges of the pad, and the two peripheral edges are opposite one another.

40. The method of claim 31, wherein the contact terminal is the only electrical conductor that is electrically connected to the pad and extends to the side of the insulative base that faces away from the chip after forming the connection joint.

41. The method of claim 31, wherein forming the opening includes applying a wet chemical etch that removes a portion of the metal base.

42. The method of claim 31, wherein forming the opening includes applying a laser that removes portions of the insulative base and the adhesive.

43. The method of claim 31, wherein forming the opening includes applying a wet chemical etch that removes a portion of the metal base and then applying a laser that removes portions of the insulative base and the adhesive.

44. The method of claim 31, wherein removing the portion of the metal base includes applying a wet chemical etch that is selective of the metal base with respect to the contact terminal.

45. The method of claim 31, wherein removing the portion of the metal base removes all remaining portions of the metal base.

46. The method of claim 31, wherein forming the connection point includes electroplating a metal on the routing line and the pad.

47. The method of claim 31, wherein the connection joint contacts a surface of the routing line that is disposed above and overlaps and faces away from the pad, and the connection joint contacts a peripheral sidewall of the routing line that is disposed above and overlaps and is orthogonal to the pad.

48. The method of claim 31, wherein the connection point is the only electrical conductor external to the chip that contacts the pad, the connection joint and the adhesive are the only materials external to the chip that contact the pad, and the connection joint and the adhesive are the only materials that contact both the conductive trace and the pad.

49. The method of claim 31, wherein the metal base, the routing line and the connection joint are copper, and the contact terminal includes a copper layer and a non-copper layer.

50. The method of claim 31, wherein the connection joint is devoid of wire bonds, TAB leads and solder joints.

51. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the metal layer and the insulative base and into the metal base;

depositing a contact terminal into the via, wherein the contact terminal contacts the metal base and the metal layer and extends through the insulative base;

providing a first etch mask over the metal layer;

applying an etch to the metal layer using the first etch mask to selectively protect the metal layer, thereby forming a routing line that includes an unetched portion of the metal layer, wherein a conductive trace includes the routing line and the contact terminal;

mechanically attaching a chip to the laminated structure using an insulative adhesive, wherein the chip includes a conductive pad, the metal base is disposed on a side of the insulative base that faces away from the chip, the routing line is disposed on a side of the insulative base that faces towards the chip, the routing line extends outside a periphery of the pad, and the contact terminal is disposed outside the periphery of the pad and extends beyond the insulative base in a direction away from the chip;

providing a second etch mask over the metal base;

applying an etch to the metal base using the second etch mask to selectively protect the metal base, thereby removing a first portion of the metal base; then removing a portion of the insulative base that overlaps the routing line and the pad;

removing a portion of the adhesive that overlaps the pad, thereby forming an opening that extends through the metal base, the insulative base and the adhesive, exposes the routing line and the pad and is spaced from the contact terminal;

forming a connection joint in the opening that contacts and electrically connects the routing line and the pad; and then removing a second portion of the metal base that contacts the contact terminal, thereby electrically isolating the pad from other conductive pads of the chip.

52. The method of claim 51, wherein providing the first etch mask includes depositing a first photoresist layer over the metal layer and selectively patterning the first photoresist layer, and providing the second etch mask includes depositing a second photoresist layer over the metal base and selectively patterning the second photoresist layer.

53. The method of claim 51, wherein removing the first and second portions of the metal base includes applying first and second wet chemical etches that are highly selective of the metal base with respect to the insulative base and the contact terminal.

54. The method of claim 51, wherein removing the portions of the insulative base and the adhesive includes applying a laser that ablates the insulative base and the adhesive.

55. The method of claim 51, wherein forming the connection joint includes electroplating a metal on the routing line and the pad.

56. The method of claim 51, wherein removing the second portion of the metal base removes all remaining portions of the metal base.

57. The method of claim 51, wherein the adhesive extends through the routing line and the insulative base and into the metal base inside the via.

58. The method of claim 51, including forming an encapsulant on the chip after attaching the chip to the laminated structure and before forming the opening. wherein the encapsulant extends through the routing line and the insulative base and into the metal base inside the via.

59. The method of claim 51, wherein the metal base, the metal layer and the connection joint are copper, the contact terminal includes a copper layer and a non-copper layer, the insulative base includes polyimide or epoxy, and the adhesive includes silicone, polyimide or epoxy.

60. The method of claim 51, wherein the connection joint is devoid of wire bonds, TAB leads and solder joints.

61. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the metal layer and the insulative base and into the metal base;

forming a contact terminal in the via, wherein the contact terminal contacts the metal base and the metal layer and extends through the insulative base;

forming a routing line that includes a first portion of the metal layer, wherein forming the routing line includes selectively removing a second portion of the metal layer; then mechanically attaching a chip to the laminated structure using an insulative adhesive, wherein the chip includes a conductive pad, a conductive trace includes the routing line and the contact terminal, the metal base is disposed on a side of the insulative base that faces away from the chip, and the routing line is disposed on a side of the insulative base that faces towards the chip; then exposing the routing line and the pad through an opening that extends through the metal base, the insulative base and the adhesive;

forming a connection joint in the opening that contacts and electrically connects the routing line and the pad;

depositing an insulator in the opening that contacts the insulative base and the connection joint; and then removing a portion of the metal base that contacts the contact terminal, thereby electrically isolating the pad from other conductive pads of the chip.

62. The method of claim 61, wherein forming the via includes mechanically drilling through the metal layer and the insulative base and into the metal base.

63. The method of claim 62, including applying a wet chemical etch to the metal base and the metal layer in the via such that the metal base and the metal layer are recessed relative to the insulative base in the via.

64. The method of claim 61, wherein forming the contact terminal includes:

depositing a first portion of the contact terminal into the via and on the metal base without depositing the first portion of the contact terminal on the metal layer; and then depositing a second portion of the contact terminal into the via and on the first portion of the contact terminal and the metal layer without depositing the second portion of the contact terminal on the metal base, wherein the second portion of the contact terminal extends through the insulative base.

65. The method claim 64, wherein depositing the first portion of the contact terminal includes electroplating the first portion of the contact terminal into the via and on the metal base.

66. The method of claim 65, wherein electroplating the first portion of the contact terminal includes electroplating a first layer of the first portion of the contact terminal into the via and on the metal base, and then electroplating a second layer of the first portion of the contact terminal on the first layer.

67. The method of claim 66, wherein the metal base, the metal layer, the second layer and the second portion are copper, and the first layer is a non-copper metal.

68. The method of claim 64, wherein depositing the second portion of the contact terminal includes electrolessly plating a first layer of the second portion of the contact terminal on the first portion of the contact terminal and the metal layer, wherein the first layer of the second portion extends through the insulative base.

69. The method of claim 68, wherein depositing the second portion of the contact terminal includes electroplating a second layer of the second portion of the contact terminal on the first layer.

70. The method of claim 69, wherein the metal base, the metal layer and the first and second layers are copper.

71. The method of claim 61, wherein forming the routing line includes:
   forming a photoresist layer;
   etching the metal layer using the photoresist layer as an etch mask; and
   removing the photoresist layer.

72. The method of claim 61, wherein forming the opening includes applying a wet chemical etch to the metal base, thereby exposing the insulative base, and then applying a laser that ablates the insulative base and the adhesive, thereby exposing the routing line and the pad.

73. The method of claim 61, wherein forming the connection joint includes electroplating a metal on the routing line and the pad during an electroplating operation in which a plating bus provides current to the metal base, the metal base provides the current to the contact terminal, and the contact terminal provides the current to the routing line.

74. The method of claim 61, wherein removing the portion of the metal base includes applying a wet chemical etch that removes all remaining portions of the metal base without removing the contact terminal.

75. The method of claim 61, wherein the contact terminal is disposed within a periphery of the chip, and the adhesive extends into the via and through the routing line and the insulative base and contacts the contact terminal.

76. The method of claim 61, including forming an encapsulant on a side of the chip opposite the pad, the insulative base and the routing line after attaching the chip to the laminated structure and before forming the opening, wherein the routing line extends within and outside a periphery of the chip, the contact terminal is disposed outside the periphery of the chip, and the encapsulant extends into the via and through the routing line and the insulative base and contacts the contact terminal.

77. The method of claim 61, wherein the connection joint contacts a surface of the routing line that is disposed above and overlaps and faces away from the pad, and the connection joint contacts a peripheral sidewall of the routing line that is disposed above and overlaps and is orthogonal to the pad.

78. The method of claim 61, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the contact terminal is the only electrical conductor that is electrically connected to the pad and extends to the side of the insulative base that faces away from the chip.

79. The method of claim 61, wherein the steps are performed in the sequence set forth.

80. The method of claim 61, wherein the connection joint is devoid of wire bonds, TAB leads and solder joints.

81. A method of connecting a conductive trace and an insulative base to a semiconductor chip, comprising the following steps in the sequence set forth:
   providing a laminated structure that includes a metal base, an insulative base and a metal layer, wherein the metal base and the metal layer are disposed on opposite sides of the insulative base;
   forming a via in the laminated structure that extends through the metal layer and the insulative base and into the metal base;
   forming a conductive trace that includes a routing line and a contact terminal, wherein the routing line includes an unetched portion of the metal layer, and the contact terminal includes a plated metal that contacts the metal base and the metal layer in the via and extends through the insulative base in the via;
   mechanically attaching a chip to the laminated structure using an insulative adhesive, wherein the chip includes a conductive pad, the metal base is disposed on a side of the insulative base that faces away from the chip, and the routing line is disposed on a side of the insulative base that faces towards the chip;
   exposing the routing line and the pad through an opening that extends through the metal base, the insulative base and the adhesive and is spaced from the contact terminal;
   forming a connection joint in the opening that contacts and electrically connects the routing line and the pad and is spaced from the metal base; and
   removing a portion of the metal base that contacts the contact terminal such that none of the metal base contacts the contact terminal, thereby electrically isolating the pad from other conductive pads of the chip.

82. The method of claim 81, wherein forming the contact terminal includes:
   electroplating a first portion of the contact terminal into the via and on the metal base without depositing the first portion of the contact terminal on the metal layer; and then
   electrolessly depositing a second portion of the contact terminal into the via and on the first portion of the contact terminal and the metal layer without depositing the second portion of the contact terminal on the metal base, wherein the second portion of the contact terminal extends through the insulative base.

83. The method of claim 81, wherein forming the routing line includes:
   forming a photoresist layer;
   etching the metal layer using the photoresist layer as an etch mask; and
   removing the photoresist layer.

84. The method of claim 81, wherein forming the opening includes applying a wet chemical etch to the metal base and then applying a laser that ablates the insulative base and the adhesive.

85. The method of claim 81, wherein forming the connection joint includes electroplating a first metal portion on the routing line and the pad and a second metal portion on the metal base during an electroplating operation in which a plating bus provides current to the metal base, the metal base provides the current to the contact terminal, the contact terminal provides the current to the routing line, and the first and second metal portions are separated from one another.

86. The method of claim 85, wherein the metal base, the metal layer and the first and second metal portions are copper.

87. The method of claim 81, wherein removing the portion of the metal base removes all remaining portions of the metal base.

88. The method of claim 81, wherein the connection joint contacts a surface of the routing line that is disposed above and overlaps and faces away from the pad, and the connection joint contacts a peripheral sidewall of the routing line that is disposed above and overlaps and is orthogonal to the pad.

89. The method of claim 81, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the contact terminal is the only electrical conductor that is electrically connected to the pad and extends to the side of the insulative base that faces away from the chip.

90. The method of claim 81, wherein the connection joint is devoid of wire bonds, TAB leads and solder joints.

91. A method of connecting a conductive trace and an insulative base to a semiconductor chip, comprising the following steps in the sequence set forth:

providing a laminated structure that includes a metal base, an insulative base and a metal layer, wherein the metal base and the metal layer are disposed on opposite sides of the insulative base;

forming a via in the laminated structure that extends through the metal layer and the insulative base and into the metal base;

forming a conductive trace that includes a routing line and a contact terminal, wherein the routing line includes an unetched portion of the metal layer, and the contact terminal includes a plated metal that contacts the metal base and the metal layer in the via and extends through the insulative base in the via;

mechanically attaching a chip to the laminated structure using an insulative adhesive, wherein the chip includes a conductive pad, the metal base is disposed on a side of the insulative base that faces away from the chip, and the routing line is disposed on a side of the insulative base that faces towards the chip;

exposing the routing line and the pad through an opening that extends through the metal base, the insulative base and the adhesive and is spaced from the contact terminal;

forming a connection joint in the opening that contacts and electrically connects the routing line and the pad and is spaced from the metal base;

depositing an insulator in the opening that contacts the insulative base and the connection joint; and removing a portion of the metal base that contacts the contact terminal such that none of the metal base contacts the contact terminal, thereby electrically isolating the pad from other conductive pads of the chip.

92. The method of claim 91, wherein forming the contact terminal includes:

electroplating a first portion of the contact terminal into the via and on the metal base without depositing the first portion of the contact terminal on the metal layer, and then electrolessly depositing a second portion of the contact terminal into the via and on the first portion of the contact terminal and the metal layer without depositing the second portion of the contact terminal on the metal base, wherein the second portion of the contact terminal extends through the insulative base.

93. The method of claim 91, wherein forming the routing line includes:

forming a photoresist layer;

etching the metal layer using the photoresist layer as an etch mask; and removing the photoresist layer.

94. The method of claim 91, wherein forming the opening includes applying a wet chemical etch to the metal base and then applying a laser that ablates the insulative base and the adhesive.

95. The method of claim 91, wherein forming the connection joint includes electroplating a first metal portion on the routing line and the pad and a second metal portion on the metal base during an electroplating operation in which a plating bus provides current to the metal base, the metal base provides the current to the contact terminal, the contact terminal provides the current to the routing line, and the first and second metal portions are separated from one another.

96. The method of claim 95, wherein the metal base, the metal layer and the first and second metal portions are copper.

97. The method of claim 91, wherein removing the portion of the metal base removes all remaining portions of the metal base.

98. The method of claim 91, wherein the connection joint contacts a surface of the routing line that is disposed above and overlaps and faces away from the pad, and the connection joint contacts a peripheral sidewall or the routing line that is disposed above and overlaps and is orthogonal to the pad.

99. The method of claim 91, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the contact terminal is the only electrical conductor that is electrically connected to the pad and extends to the side of the insulative base that faces away from the chip.

100. The method of claim 91, wherein the connection joint is devoid of wire bonds, TAB leads and solder joints.

101. A method of connecting a conductive trace and an insulative base to a semiconductor chip, comprising:

providing a semiconductor chip, a metal base, an insulative base and a conductive trace, wherein the chip includes a conductive pad, the metal base is disposed on a side of the insulative base that faces away from the chip, the conductive trace includes a contact terminal that extends through the insulative base, and the pad is exposed through an opening that extends through the metal base and the insulative base and is spaced from the contact terminal; then forming a connection joint that contacts and electrically connects the conductive trace and the pad; and then removing a portion of the metal base that contacts the contact terminal, thereby electrically isolating the pad from other conductive pads of the chip.

102. The method of claim 101, including mechanically attaching the chip to the conductive trace using an insulative adhesive before forming the opening.

103. The method of claim 102, including forming the opening through the adhesive.

104. The method of claim 103, wherein the adhesive contacts and is sandwiched between the conductive trace and the pad, and the conductive trace and the pad are electrically isolated from one another after forming the opening and before forming the connection joint.

105. The method of claim 103, including attaching the conductive trace to the insulative base before attaching the chip to the conductive trace.

106. The method of claim 103, wherein forming the opening includes applying a wet chemical etch to the metal base and then applying a laser that ablates the insulative base and the adhesive.

107. The method of claim 101, including:
providing a laminated structure that includes the metal base, the insulative base and the conductive trace; then
mechanically attaching the laminated structure to the chip; then
removing a portion of the insulative base that overlaps the pad; then
forming the connection joint; and then
etching the metal base to remove the portion of the metal base that contacts the contact terminal.

108. The method of claim 101, including depositing an insulator into the opening and on the insulative base and the connection joint before removing the portion of the metal base.

109. The method of claim 101, wherein the metal base and the connection point are copper.

110. The method of claim 101, wherein the connection joint is devoid of wire bonds, TAB leads and solder joints.

111. A method of connecting a conductive trace and an insulative base to a semiconductor chip, comprising:
providing a semiconductor chip that includes a conductive pad;
providing a laminated structure that includes a conductive trace, an insulative base and a metal base, wherein the conductive trace includes a contact terminal and a routing line, and the contact terminal extends through the insulative base and into the metal base; then
disposing an insulative adhesive between the chip and the laminated structure, thereby mechanically attaching the chip to the laminated structure such that the metal base is disposed on a side of the insulative base that faces away from the chip, and the routing line is disposed on a side of the insulative base that faces towards the chip;
exposing the routing line and the pad through an opening that extends through the metal base, the insulative base and the adhesive and is spaced from the contact terminal; then
forming a connection joint that contacts and electrically connects the routing line and the pad; and then
removing a portion of the metal base that contacts the contact terminal, thereby electrically isolating the pad from other conductive pads of the chip.

112. The method of claim 111, wherein the routing line overlaps only one peripheral edge of the pad.

113. The method of claim 111, wherein the routing line overlaps only two peripheral edges of the pad, and the peripheral edges are opposite one another.

114. The method of claim 111, wherein the routing line overlaps at least one peripheral edge of the pad and overlaps a center of the pad but does not overlap each peripheral edge of the pad.

115. The method of claim 111, wherein forming the opening includes applying a wet chemical etch that removes a portion of the metal base.

116. The method of claim 111, wherein forming the opening includes applying a laser that ablates the insulative base and the adhesive.

117. The method of claim 111, wherein forming the opening includes applying a wet chemical etch that removes a portion of the metal base and then applying a laser that ablates the insulative base and the adhesive.

118. The method of claim 111, wherein the removing the portion of the metal base exposes a distal end of the contact terminal that faces away from the chip.

119. The method of claim 111, wherein the removing the portion of the metal base removes all remaining portions of the metal base.

120. The method of claim 111, wherein the connection joint contacts a surface of the routing line that is disposed above and overlaps and faces away from the pad.

121. The method of claim 111, wherein the connection joint contacts opposing peripheral sidewalls of the routing line that are disposed above and overlap and are of orthogonal to the pad.

122. The method of claim 111, wherein the connection joint is the only electrical conductor external to the chip that contacts the pad.

123. The method of claim 111, wherein the connection joint and the adhesive are the only materials external to the chip that contact the pad.

124. The method of claim 111, wherein the connection joint and the adhesive are the only materials that contact both the conductive trace and the pad.

125. The method of claim 111, wherein the connection joint is formed by electroplating.

126. The method of claim 111, wherein the routing line overlaps the pad and extends within and outside a periphery of the chip, and the contact terminal is disposed outside the periphery of the chip.

127. The method of claim 111, wherein the adhesive extends through the insulative base and into the metal base inside the contact terminal.

128. The method of claim 111, including forming an encapsulant on the chip after attaching the chip to the laminated structure and before forming the opening, wherein the encapsulant extends through the insulative base and into the metal base inside the contact terminal.

129. The method of claim 111, wherein the contact terminal is the only electrical conductor that is electrically connected to the pad and extends to the side of the insulative base that faces away from the chip.

130. The method of claim 111, wherein the connection joint is devoid of wire bonds, TAB leads and solder joints.

131. A method of connecting a conductive trace and an insulative base to a semiconductor chip, comprising the following steps in the sequence set forth:
providing a laminated structure that includes a conductive trace, an insulative base and a metal base, wherein the conductive trace includes a routing line and a contact terminal, the metal base and the routing line are disposed on opposite sides of the insulative base, and the contact terminal extends through the insulative base and into the metal base;
disposing an insulative adhesive between a chip and the laminated structure, thereby mechanically attaching the chip to the laminated structure, wherein the chip includes a conductive pad, the metal base is disposed on a side of the insulative base that faces away from the chip, and the routing line is disposed on a side of the insulative base that faces towards the chip;
forming a connection joint that contacts and electrically connects the routing line and the pad, wherein the connection joint is formed in an opening that exposes the routing line and the pad and extends through the metal base, the insulative base and the adhesive and is spaced from the contact terminal; and removing a portion of the metal base that contacts the contact terminal, thereby electrically isolating the pad from other conductive pads of the chip.

132. The method of claim 131, wherein forming the conductive trace includes forming the routing line subtractively and forming the contact terminal additively.

133. The method of claim 131, wherein forming the routing line includes:

providing a metal layer in contact with the insulative base;

forming a photoresist layer;

etching the metal layer using the photoresist layer as an etch mask; and removing the photoresist layer.

134. The method of claim 131, wherein forming the contact terminal includes:

providing a metal layer in contact with the insulative base, wherein the metal base and the metal layer are disposed on opposite sides of the insulative base;

forming a via that extends through the metal layer and the insulative base and into but not through the metal base; and depositing the contact terminal into the via, wherein the contact terminal extends through the metal layer and the insulative base and into but not through the metal base.

135. The method of claim 131, wherein forming the contact terminal includes:

providing a metal layer in contact with the insulative base, wherein the metal base and the metal layer are disposed on opposite sides of the insulative base;

forming a via that extends through the metal layer, the insulative base and the metal base; and depositing the contact terminal into the via, wherein the contact terminal extends through the metal layer, the insulative base and the metal base.

136. The method of claim 131, wherein the adhesive extends through the routing line and the insulative base and into the metal base inside the contact terminal.

137. The method of claim 131, including forming an encapsulant on the chip after attaching the chip to the laminated structure and before forming the opening, wherein the encapsulant extends through the routing line and the insulative base and into the metal base inside the contact terminal.

138. The method of claim 131, wherein the routing line overlaps only one peripheral edge of the pad.

139. The method of claim 131, wherein the routing line overlaps only two peripheral edges of the pad, and the two peripheral edges are opposite one another.

140. The method of claim 131, wherein the contact terminal is the only electrical conductor that is electrically connected to the pad and extends to the side of the insulative base that faces away from the chip after forming the connection joint.

141. The method of claim 131, wherein forming the opening includes applying a wet chemical etch that removes a portion of the metal base.

142. The method of claim 131, wherein forming the opening includes applying a laser that removes portions of the insulative base and the adhesive.

143. The method of claim 131, wherein forming the opening includes applying a wet chemical etch that removes a portion of the metal base and then applying a laser that removes portions of the insulative base and the adhesive.

144. The method of claim 131, wherein removing the portion of the metal base includes applying a wet chemical etch that is selective of the metal base with respect to the contact terminal.

145. The method of claim 131, wherein removing the portion of the metal base removes all remaining portions of the metal base.

146. The method of claim 131, wherein forming the connection joint includes electroplating a metal on the routing line and the pad.

147. The method of claim 131, wherein the connection joint contacts a surface of the routing line that is disposed above and overlaps and faces away from the pad, and the connection joint contacts a peripheral sidewall of the routing line that is disposed above and overlaps and is orthogonal to the pad.

148. The method of claim 131, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

149. The method of claim 131, wherein the metal base, the routing line and the connection joint are copper, and the contact terminal includes a copper layer and a non-copper layer.

150. The method of claim 131, wherein the connection joint is devoid of wire bonds, TAB leads and solder joints.

151. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a via in the laminated structure that extends through the metal layer and the insulative base and into the metal base;

depositing a contact terminal into the via, wherein the contact terminal contacts the metal base and the metal layer and extends through the insulative base;

providing a first etch mask over the metal layer;

applying an etch to the metal layer using the first etch mask to selectively protect the metal layer, thereby forming a routing line that includes an unetched portion of the metal layer, wherein a conductive trace includes the routing line and the contact terminal;

mechanically attaching a chip to the laminated structure using an insulative adhesive, wherein the chip includes a conductive pad, the metal base is disposed on a side of the insulative base that faces away from the chip, the routing line is disposed on a side of the insulative base that faces towards the chip, the routing line extends outside a periphery of the pad, and the contact terminal is disposed outside the periphery of the pad and extends beyond the insulative base in a direction away from the chip;

providing a second etch mask over the metal base;

applying an etch to the metal base using the second etch mask to selectively protect the metal base, thereby removing a first portion of the metal base;

removing a portion of the insulative base and a portion of the adhesive, thereby forming an opening that extends through the metal base, the insulative base and the adhesive and is spaced from the contact terminal;

exposing the routing line and the pad though the opening; then forming a connection joint in the opening that contacts and electrically connects the routing line and the pad; and then removing a second portion of the metal base that contacts the contact terminal, thereby electrically isolating the pad from other conductive pads of the chip.

152. The method of claim 151, wherein providing the first etch mask includes depositing a first photoresist layer over the metal layer and selectively patterning the first photoresist layer, and providing the second etch mask includes depositing a second photoresist layer over the metal base and selectively patterning the second photoresist layer.

153. The method of claim 151, wherein removing the first and second portions of the metal base includes applying first and second wet chemical etches that are highly selective of the metal base with respect to the insulative base and the contact terminal.

154. The method of claim 151, wherein removing the portions of the insulative base and the adhesive includes applying a laser that ablates the insulative base and the adhesive.

155. The method of claim 151, wherein forming the connection joint includes electroplating a metal on the routing line and the pad.

156. The method of claim 151, wherein removing the second portion of the metal base removes all remaining portions of the metal base.

157. The method of claim 151, wherein the adhesive extends through the routing line and the insulative base and into the metal base inside the via.

158. The method of claim 151, including forming an encapsulant the chip after attaching the chip to the laminated structure and before forming the opening, wherein the encapsulant extends through the routing line and the insulative base and into the metal base inside the via.

159. The method of claim 151, wherein the metal base, the metal layer and the connection joint are copper, the contact terminal includes a copper layer and a non-copper layer, the insulative base includes polyimide or epoxy, and the adhesive includes silicone, polyimide or epoxy.

160. The method of claim 151, wherein the connection joint is devoid of wire bonds, TAB leads and solder joints.

161. A method of connecting a conductive trace and an insulative base to a semiconductor chip, comprising:

providing a laminated structure that includes a metal base, an insulative base and a metal layer, wherein the metal base and the metal foyer are disposed on opposite sides of the insulative base;

forming a via in the laminated structure that extends through the metal layer and the insulative base and into the metal base;

forming a contact terminal in the via, wherein the contact terminal contacts the metal base and the metal layer and extends through the insulative base;

forming a routing line that includes a first portion of the metal layer, wherein forming the routing line includes selectively removing a second portion of the metal layer; then mechanically attaching a chip to the laminated structure using an insulative adhesive, wherein the chip includes a conductive pad, a conductive trace includes the routing line and the contact terminal, the metal base is disposed on a side of the insulative base that faces away from the chip, and the routing line is disposed on a side of the insulative base that faces towards the chip;

exposing the routing line and the pad through an opening that extends through the metal base, the insulative base and the adhesive;

forming a connection joint in the opening that contacts and electrically connects the routing line and the pad;

depositing an insulator in the opening that contacts the insulative base and the connection joint; and then removing a portion of the metal base that contacts the contact terminal, thereby electrically isolating the pad from other conductive pads of the chip.

162. The method of claim 161, wherein forming the via includes mechanically drilling through the metal layer and the insulative base and into the metal base.

163. The method of claim 162, including applying a wet chemical etch to the metal base and the metal layer in the via such that the metal base and the metal layer are recessed relative to the insulative base in the via.

164. The method of claim 161, wherein forming the contact terminal includes:

depositing a first portion of the contact terminal into the via and on the metal base without depositing the first portion of the contact terminal an the metal layer; and then depositing a second portion of the contact terminal into the via and on the first portion of the contact terminal and the metal layer without depositing the second portion of the contact terminal on the metal base, wherein the second portion of the contact terminal extends through the insulative base.

165. The method of claim 164, wherein depositing the first portion of the contact terminal includes electroplating the first portion of the contact terminal into the via and on the metal base.

166. The method of claim 165, wherein electroplating the first portion of the contact terminal includes electroplating a first layer of the first portion of the contact terminal into the via and on the metal base, and then electroplating a second layer of the first portion of the contact terminal on the first layer.

167. The method of claim 166, wherein the metal base, the metal layer, the second layer and the second portion are copper, and the first layer is a non-copper metal.

168. The method of claim 164, wherein depositing the second portion of the contact terminal includes electrolessly plating a first layer of the second portion of the contact terminal on the first portion of the contact terminal and the metal layer, wherein the first layer of the second portion extends through the insulative base.

169. The method of claim 168, wherein depositing the second portion of the contact terminal includes electroplating a second layer of the second portion of the contact terminal on the first layer.

170. The method of claim 169, wherein the metal base, the metal layer and the first and second layers are copper.

171. The method of claim 161, wherein forming the routing line includes:

forming a photoresist layer;

etching the metal layer using the photoresist layer as an etch mask; and removing the photoresist layer.

172. The method of claim 161, wherein forming the opening includes applying a wet chemical etch to the metal base, thereby exposing the insulative base, and then applying a laser that ablates the insulative base and the adhesive, thereby exposing the routing line and the pad.

173. The method of claim 161, wherein forming the connection joint includes electroplating a metal on the routing line and the pad during an electroplating operation in which a plating bus provides current to the metal base, the metal base provides the current to the contact terminal, and the contact terminal provides the current to the routing line.

174. The method of claim 161, wherein removing the portion of the metal base includes applying a wet chemical etch that removes all remaining portions of the metal base without removing the contact terminal.

175. The method of claim 161, wherein the contact terminal is disposed within a periphery of the chip, and the adhesive extends into the via and through the routing line and the insulative base and contacts the contact terminal.

176. The method of claim 161, including forming an encapsulant on a side of the chip opposite the pad, the insulative base and the routing line after attaching the chip to the laminated structure and before forming the opening, wherein the routing line extends within and outside a periphery of the chip, the contact terminal is disposed outside the periphery of the chip, and the encapsulant extends into the via and through the routing line and the insulative base and contacts the contact terminal.

177. The method of claim 161, wherein the connection joint contacts a surface of the routing line that is disposed above and overlaps and faces away from the pad, and the connection joint contacts a peripheral sidewall of the routing line that is disposed above and overlaps and is orthogonal to the pad.

178. The method of claim 161, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the contact terminal is the only electrical conductor that is electrically connected to the pad and extends to the side of the insulative base that faces away from the chip.

179. The method of claim 161, wherein the steps are performed in the sequence set forth.

180. The method of claim 161, wherein the connection joint is devoid of wire bonds, TAB leads and solder joints.

181. A method of connecting a conductive trace and an insulative base to a semiconductor chip, comprising the following steps in the sequence set forth:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;
forming a conductive trace that includes a routing line and a contact terminal, wherein the routing line includes an unetched portion of the metal layer, and the contact terminal includes a plated metal that contacts the metal base and the metal layer in the via and extends through the insulative base in the via;
mechanically attaching a chip to the laminated structure using an insulative adhesive, wherein the chip includes a conductive pad, the metal base is disposed on a side of the insulative base that faces away from the chip, and the routing line is disposed on a side of the insulative base that faces towards the chip;
forming a connection joint that contacts and electrically connects the routing line and the pad and is spaced from the metal base, wherein the connection joint is formed in an opening that exposes the routing line and the pad and extends through the metal base, the insulative base and the adhesive and is spaced from the contact terminal; and removing a portion of the metal base that contacts the contact terminal such that none of the metal base contacts the contact terminal, thereby electrically isolating the pad from other conductive pads of the chip.

182. The method of claim 181, wherein forming the contact terminal includes:
electroplating a first portion of the contact terminal into the via and on the metal base without depositing the first portion of the contact terminal on the metal layer; and then
electrolessly depositing a second portion of the contact terminal into the via and on the first portion of the contact terminal and the metal layer without depositing the second portion of the contact terminal on the metal base wherein the second portion of the contact terminal extends through the insulative base.

183. The method of claim 181, wherein forming the routing line includes:
forming a photoresist layer;
etching the metal layer using the photoresist layer as an etch mask; and
removing the photoresist layer.

184. The method of claim 181, wherein forming the opening includes applying a wet chemical etch to the metal base and then applying a laser that ablates the insulative base and the adhesive.

185. The method of claim 181, wherein forming the connection joint includes electroplating a first metal portion on the routing line and the pad and a second metal portion on the metal base during an electroplating operation in which a plating bus provides current to the metal base, the metal base provides the current to the contact terminal, the contact terminal provides the current to the routing line, and the first and second metal portions are separated from one another.

186. The method of claim 185, wherein the metal base, the metal layer and the first and second metal portions are copper.

187. The method of claim 181, wherein removing the portion of the metal base removes all remaining portions of the metal base.

188. The method of claim 181, wherein the connection joint contacts a surface of the routing line that is disposed above and overlaps and faces away from the pad, and the connection joint contacts a peripheral sidewall of the routing line that is disposed above and overlaps and is orthogonal to the pad.

189. The method of claim 181, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the contact terminal is the only electrical conductor that is electrically connected to the pad and extends to the side of the insulative base that faces away from the chip.

190. The method of claim 181, wherein the connection joint is devoid of wire bonds, TAB leads and solder joints.

191. A method of connecting a conductive trace and an insulative base to a semiconductor chip, comprising the following steps in the sequence set forth:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;

forming a conductive trace that includes a routing line and a contact terminal, wherein the routing line includes an unetched portion of the metal layer, and the contact terminal includes a plated metal that contacts the metal base and the metal layer in the via and extends through the insulative base in the via;

mechanically attaching a chip to the laminated structure using an insulative adhesive, wherein the chip includes a conductive pad, the metal base is disposed on a side of the insulative base that faces away from the chip, and the routing line is disposed on a side of the insulative base that faces towards the chip;

forming a connection joint that contacts and electrically connects the routing line and the pad and is spaced from the metal base, wherein the connection joint is formed in an opening that exposes the routing line and the pad and extends through the metal base, the insulative base and the adhesive and is spaced from the contact terminal;

depositing an insulator in the opening that contacts the insulative base and the connection joint; and removing a portion of the metal base that contacts the contact terminal such that none of the metal base contacts the contact terminal, thereby electrically isolating the pad from other conductive pads of the chip.

192. The method of claim 191, wherein forming the contact terminal includes:

electroplating a first portion of the contact terminal into the via and on the metal base without depositing the first portion of the contact terminal on the metal layer; and then electrolessly depositing a second portion of the contact terminal into the via and on the first portion of the contact terminal and the metal layer without depositing the second portion of the contact terminal on the metal base, wherein the second portion of the contact terminal extends through the insulative base.

193. The method of claim 191, wherein forming the routing line includes:

forming a photoresist layer;

etching the metal layer using the photoresist layer as an etch mask; and removing the photoresist layer.

194. The method of claim 191, wherein forming the opening includes applying a wet chemical etch to the metal base and then applying a laser that ablates the insulative base and the adhesive.

195. The method of claim 191, wherein forming the connection joint includes electroplating a first metal portion on the routing line and the pad and a second metal portion on the metal base during an electroplating operation in which a plating bus provides current to the metal base, the metal base provides the current to the contact terminal, the contact terminal provides the current to the routing line, and the first and second metal portions are separated from one another.

196. The method claim 195, wherein the metal base, the metal layer and the first and second metal portions are copper.

197. The method of claim 191, wherein removing the portion of the metal base removes all remaining portions of the metal base.

198. The method of claim 191, wherein the connection joint contacts a surface of the routing line that is disposed above and overlaps and faces away from the pad, and the connection joint contacts a peripheral sidewall of the routing line that is disposed above and overlaps and is orthogonal to the pad.

199. The method of claim 191, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the contact terminal is the only electrical conductor that is electrically connected to the pad and extends to the side of the insulative base that faces away from the chip.

200. The method of claim 191, wherein the connection joint is devoid of wire bonds, TAB leads and solder joints.

201. A method of connecting a conductive trace and an insulative base to a semiconductor chip, comprising:

providing a semiconductor chip, a metal base, an insulative base and a conductive trace, wherein the chip includes a conductive pad, the metal base is disposed on a side of the insulative base that faces away from the chip, the conductive trace includes a contact terminal that extends through the insulative base, and the pad is exposed through an opening that extends through the metal base and the insulative base and is spaced from the contact terminal; then forming a connection joint that contacts and electrically connects the conductive trace and the pad; and then removing a portion of the metal base that contacts (i) the contact terminal and (ii) a portion of the side of the insulative base that faces away from the chip that surrounds and is adjacent to and outside the periphery of the contact terminal.

202. The method of claim 201, including mechanically attaching the chip to the conductive trace using an insulative adhesive before forming the opening.

203. The method of claim 202, including forming the opening through the adhesive.

204. The method of claim 203, wherein the adhesive contacts and is sandwiched between the conductive trace and the pad, and the conductive trace and the pad are electrically isolated from one another after forming the opening and before forming the connection joint.

205. The method of claim 203, including attaching the conductive trace to the insulative base before attaching the chip to the conductive trace.

206. The method of claim 203, wherein forming the opening includes applying a wet chemical etch to the metal base and then applying a laser that ablates the insulative base and the adhesive.

207. The method of claim 201, including:

providing a laminated structure that includes the metal base, the insulative base and the conductive trace; then mechanically attaching the laminated structure to the chip; then removing a portion of the insulative base that overlaps the pad; then forming the connection joint; and then etching the metal base to remove the portion of the metal base that contacts the contact terminal.

208. The method of claim 201, including depositing an insulator into the opening and on the insulative base and the connection joint before removing the portion of the metal base.

209. The method of claim 201, wherein the metal base and the connecting joint are copper.

210. The method of claim 201, wherein the connection joint is devoid of wire bonds, TAB leads and solder joints.

211. A method of connecting a conductive trace and an insulative base to a semiconductor chip, comprising:

providing a semiconductor chip that includes a conductive pad;

providing a laminated structure that includes a conductive trace, an insulative base and a metal base, wherein the conductive trace includes a contact terminal and a routing line, and the contact terminal extends through the insulative base and into the metal base; then disposing an insulative adhesive between the chip and the laminated structure, thereby mechanically attaching the chip to the laminated structure such that the metal base is disposed on a side of the insulative base that faces away from the chip, and the routing line is disposed on a side of the insulative base that faces towards the chip;

exposing the routing line and the pad through an opening that extends through the metal base, the insulative base and the adhesive and is spaced from the contact terminal; then forming a connection point that contacts and electrically connects the routing line and the pad; and then removing a portion of the metal base that contacts (i) the contact terminal and (ii) a portion of the side of the insulative base that faces away from the chip that surrounds and is adjacent to and outside the periphery of the contact terminal.

212. The method of claim 211, wherein the routing line overlaps only one peripheral edge of the pad.

213. The method of claim 211, wherein the routing line overlaps only two peripheral edges of the pad, and the two peripheral edges are opposite one another.

214. The method of claim 211, wherein the routing line overlaps at least one peripheral edge of the pad and overlaps a center of the pad but does not overlap each peripheral edge of the pad.

215. The method of claim 211, wherein forming the opening includes applying a wet chemical etch that removes a portion of the metal base.

216. The method of claim 211, wherein forming the opening includes applying a laser that ablates the insulative base and the adhesive.

217. The method of claim 211, wherein forming the opening includes applying a wet chemical etch that removes a portion of the metal base and then applying a laser that ablates the insulative base and the adhesive.

218. The method of claim 211, wherein the removing the portion of the metal base exposes a distal end of the contact terminal that faces away from the chip.

219. The method of claim 211, wherein the removing the portion of the metal base removes all remaining portions of the metal base.

220. The method of claim 211, wherein the connection joint contacts a surface of the routing line that is disposed above and overlaps and faces away from the pad.

221. The method of claim 211, wherein the connection joint contacts opposing peripheral sidewalls of the routing line that are disposed above and overlap and are orthogonal to the pad.

222. The method of claim 211, wherein the connector joint is the only electrical conductor external to the chip that contacts the pad.

223. The method of claim 211, wherein the connection joint and the adhesive are the only materials external to the chip that contact the pad.

224. The method of claim 211, wherein the connection joint and the adhesive are the only materials that contact both the conductive trace and the pad.

225. The method of claim 211, wherein the connection joints formed by electroplating.

226. The method of claim 211, wherein the routing line overlaps the pad and extends within and outside a periphery of the chip, and the contact terminal is disposed outside the periphery of the chip.

227. The method of claim 211, wherein the adhesive extends through the insulative base and into the metal base inside the contact terminal.

228. The method of claim 211, including forming an encapsulant on the chip after attaching the chip to the laminated structure and before forming the opening, wherein the encapsulant extends through the insulative base and into the metal base inside the contact terminal.

229. The method of claim 211, wherein the contact terminal is the only electrical conductor that is electrically connected to the pad and extends to the side of the insulative base that faces away from the chip.

230. The method of claim 211, wherein the connection joint is devoid of wire bonds, TAB leads and solder joints.

231. A method of connecting a conductive trace and an insulative base to a semiconductor chip, comprising the following steps in the sequence set forth;

providing a laminated structure that includes a conductive trace, an insulative base and a metal base, wherein the conductive trace includes a routing line and a contact terminal, the metal base and the routing line are disposed on opposite sides of the insulative base, and the contact terminal extends through the insulative base and into the metal base;

disposing an insulative adhesive between a chip and the laminated structure, thereby mechanically attaching the chip to the laminated structure, wherein the chip includes a conductive pad, the metal base is disposed on a side of the insulative base that faces away from the chip, and the routing line is disposed on a side of the insulative base that faces towards the chip;

forming a connection joint that contacts and electrically connects the routing line and the pad, wherein the connection joint is formed in an opening that exposes the routing line and the pad and extends through the metal base, the insulative base and the adhesive and is spaced from the contact terminal; and removing a portion of the metal base that contacts (i) the contact terminal and (ii) a portion of the side of the insulative base that faces away from the chip that surrounds and is adjacent to and outside the periphery of the contact terminal.

232. The method of claim 231, wherein forming the conductive trace includes forming the routing line subtractively and forming the contact terminal additively.

233. The method of claim 231, wherein forming the routing line includes:

providing a metal layer in contact with the insulative base;

forming a photoresist layer;

etching the metal layer using the photoresist layer as an etch mask; and removing the photoresist layer.

234. The method of claim 231, wherein forming the contact terminal includes:

providing a metal layer in contact with the insulative base, wherein the metal base and the metal layer are disposed on opposite sides of the insulative base;

forming a via that extends through the metal layer and the insulative base and into but not through the metal base; and depositing the contact terminal into the via, wherein the contact terminal extends through the metal layer and the insulative base and into but not through the metal base.

235. The method of claim 231, wherein forming the contact terminal includes:
providing a metal layer in contact with the insulative base, wherein the metal base and the metal layer are disposed on opposite sides of the insulative base;
forming a via that extends through the metal layer, the insulative base and the metal base; and
depositing the contact terminal into the via, wherein the contact terminal extends through the metal layer, the insulative base and the metal base.

236. The method of claim 231, wherein the adhesive extends through the routing line and the insulative base and into the metal base inside the contact terminal.

237. The method of claim 231, including forming an encapsulant on the chip after attaching the chip to the laminated structure and before forming the opening, wherein the encapsulant extends through the routing line and the insulative base and into the metal base inside the contact terminal.

238. The method of claim 231, wherein the routing line overlaps only one peripheral edge of the pad.

239. The method of claim 231, wherein the routing line overlaps only two peripheral edges of the pad, and the two peripheral edges are opposite one another.

240. The method of claim 231, wherein the contact terminal is the only electrical conductor that is electrically connected to the pad and extends to the side of the insulative base that faces away from the chip after forming the connection joint.

241. The method of claim 231, wherein forming the opening includes applying a wet chemical etch that removes a portion of the metal base.

242. The method of claim 231, wherein forming the opening includes applying a laser that removes portions of the insulative base and the adhesive.

243. The method of claim 231, wherein forming the opening includes applying a wet chemical etch that removes a portion of the metal base and then applying a laser that removes portions of the insulative base and the adhesive.

244. The method of claim 231, wherein removing the portion of the metal base includes applying a wet chemical etch that is selective of the metal base with respect to the contact terminal.

245. The method of claim 231, wherein removing the portion of the metal base removes all remaining portions of the metal base.

246. The method of claim 231, wherein forming the connection joint includes electroplating a metal on the routing line and the pad.

247. The method claim 231, wherein the connection joint contacts a surface of the routing line that is disposed above and overlaps and faces away from the pad, and the connection joint contacts a peripheral sidewall of the routing line that is disposed above and overlaps and is orthogonal to the pad.

248. The method of claim 231, wherein the connection joint is the only electrical conductor external to the chip that contacts the pad, the connection joint and the adhesive are the only materials external to the chip that contact the pad, and the connection joint and the adhesive are the only materials that contact both the conductive trace and the pad.

249. The method of claim 231, wherein the metal base, the routing line and the connection joint are copper, and the contact terminal includes a copper layer and a non-copper layer.

250. The method of claim 231, wherein the connection joint is devoid of wire bonds, TAB leads and solder joints.

removing a second portion of the metal base that contacts (i) the contact terminal and (ii) a portion of the side of the insulative base that faces away from the chip that surrounds and is adjacent to and outside the periphery of the contact terminal.

251. A method of connecting a conductive trace and an insulative base to a semiconductor chip, comprising:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;
depositing a contact terminal into the via, wherein the contact terminal contacts the metal base and the metal layer and extends through the insulative base;
providing a first etch mask over the metal layer;
applying an etch to the metal layer using the first etch mask to selectively protect the metal layer, thereby forming a routing line that includes an unetched portion of the metal layer, wherein a conductive trace includes the routing line and the contact terminal;
mechanically attaching a chip to the laminated structure using an insulative adhesive, wherein the chip includes a conductive pad, the metal base is disposed on a side of the insulative base that faces away from the chip, the routing line is disposed on a side of the insulative base that faces towards the chip, the routing line extends outside a periphery of the pad, and the contact terminal is disposed outside the periphery of the pad and extends beyond the insulative base in a direction away from the chip;
providing a second etch mask over the metal base;
applying an etch to the metal base using the second etch mask to selectively protect the metal base, thereby removing a first portion of the metal base;
removing a portion of the insulative base and a portion of the adhesive, thereby forming an opening that extends through the metal base, the insulative base and the adhesive and is spaced from the contact terminal;
exposing the routing line and the pad though the opening; then
forming a connection joint in the opening that contacts and electrically connects the routing line and the pad; and then
removing a second portion of the metal base that contacts (i) the contact terminal and (ii) a portion of the side of the insulative base that faces away from the chip that surrounds and is adjacent to and outside the periphery of the contact terminal.

252. The method of claim 251, wherein providing the first etch mask includes depositing a fist photoresist layer over the metal layer and selectively patterning the first photoresist layer, and providing the second etch mask includes depositing a second photoresist layer over the metal base and selectively patterning the second photoresist layer.

253. The method of claim 251, wherein removing the first and second portions of the metal base includes applying first and second wet chemical etches that are highly selective of the metal base with respect to the insulative base and the contact terminal.

254. The method of claim 251, wherein removing the portions of the insulative base and the adhesive includes applying a laser that ablates the insulative base and the adhesive.

255. The method of claim 251, wherein forming the connection joint includes electroplating a metal on the routing line and the pad.

256. The method of claim 251, wherein removing the second portion of the metal base removes all remaining portions of the metal base.

257. The method of claim 251, wherein the adhesive extends through the routing line and the insulative base and into the metal base inside the via.

258. The method of claim 251, including forming an encapsulant on the chip after attaching the chip to the laminated structure and before forming the opening, wherein the encapsulant extends through the routing line and the insulative base and into the metal base inside the via.

259. The method of claim 251, wherein the metal base, the metal layer and the connection joint are copper, the contact terminal includes a copper layer and a non-copper layer, the insulative base includes polyimide or epoxy, and the adhesive includes silicone, polyimide or epoxy.

260. The method of claim 251, wherein the connection joint is devoid of wire bonds, TAB leads and solder joints.

261. A method of connecting a conductive trace and insulative base to a semiconductor chip, comprising:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;
forming a contact terminal in the via, wherein the contact terminal contacts the metal base and the metal layer and extends through the insulative base;
forming a routing line that includes a first portion of the metal layer, wherein forming the routing line includes selectively removing a second portion of the metal layer; then
mechanically attaching a chip to the laminated structure using an insulative adhesive, wherein the chip includes a conductive pad, a conductive trace includes the routing line and the contact terminal, the metal base is disposed on a side of the insulative base that faces away from the chip, and the routing line is disposed on a side of the insulative base that faces towards the chip;
exposing the routing line and the pad through an opening that extends through the metal base, the insulative base and the adhesive;
forming a connection joint in the opening that contacts and electrically connects the routing line and the pad;
depositing an insulator in the opening that contacts the insulative base and the connection joint; and then
removing a portion of the metal base that contacts (i) the contact terminal and (ii) a portion of the side of the insulative base that faces away from the chip that surrounds and is adjacent to and outside the periphery of the contact terminal.

262. The method of claim 261, wherein forming the via includes mechanically drilling through the metal layer and the insulative base and into the metal base.

263. The method of claim 262, including applying a wet chemical etch to the metal base and the metal layer in the via such that the metal base and the metal layer are recessed relative to the insulative base in the via.

264. The method of claim 261, wherein forming the contact terminal includes:
depositing a first portion of the contact terminal into the via and on the metal base without depositing the first portion of the contact terminal on the metal layer, and then
depositing a second portion of the contact terminal into the via and on the first portion of the contact terminal and the metal layer without depositing the second portion of the contact terminal on the metal base, wherein the second portion of the contact terminal extends through the insulative base.

265. The method of claim 264, wherein depositing the first portion of the contact terminal includes electroplating the first portion of the contact terminal into the via and on the metal base.

266. The method of claim 265, wherein electroplating the first portion of the contact terminal includes electroplating a first layer of the first portion of the contact terminal into the via and on the metal base, and then electroplating a second layer of the first portion of the contact terminal on the first layer.

267. The method of claim 266, wherein the metal base, the metal layer, the second layer and the second portion are copper, and the first layer is a non-copper metal.

268. The method of claim 264, wherein depositing the second portion of the contact terminal includes electrolessly plating a first layer of the second portion of the contact terminal on the first portion of the contact terminal and the metal layer, wherein the first layer of the second portion extends through the insulative base.

269. The method of claim 268, wherein depositing the second portion of the contact terminal includes electroplating a second layer of the second portion of the contact terminal on the first layer.

270. The method of claim 269, wherein the metal base, the metal layer and the first and second layers are copper.

271. The method of claim 261, wherein forming the routing line includes:
forming a photoresist layer;
etching the metal layer using the photoresist layer as an etch mask; and
removing the photoresist layer.

272. The method of claim 261, wherein forming the opening includes applying a wet chemical etch to the metal base, thereby exposing the insulative base, and then applying a laser that ablates the insulative base and the adhesive, thereby exposing the routing line and the pad.

273. The method of claim 261, wherein forming the connection joint includes electroplating a metal on the routing line and the pad during an electroplating operation in which a plating bus provides current to the metal base, the metal base provides the current to the contact terminal, and the contact terminal provides the current to the routing line.

274. The method of claim 261, wherein removing the portion of the metal base includes applying a wet chemical etch that removes all remaining portions of the metal base without removing the contact terminal.

275. The method of claim 261, wherein the contact terminal is disposed within a periphery of the chip, and the adhesive extends into the via and through the routing line and the insulative base and contacts the contact terminal.

276. The method of claim 261, including forming an encapsulant on a side of the chip opposite the pad, the insulative base and the routing line after attaching the chip to the laminated structure and before forming the opening, wherein the routing line extends within and outside a periphery of the chip, the contact terminal is disposed outside the periphery of the chip, and the encapsulant extends into the via and through the routing line and the insulative base and contacts the contact terminal.

277. The method of claim 261, wherein the connection joint contacts a surface of the routing line that is disposed above and overlaps and faces away from the pad, and the connection joint contacts a peripheral sidewall of the routing line that is disposed above and overlaps and is orthogonal to the pad.

278. The method of claim 261, wherein the connection joint is the only electrical conductor external to the chip that contacts the pad, the connection joint and the adhesive are the only materials external to the chip that contact the pad, the connection joint and the adhesive are the only materials that contact both the routing line and the pad, and the contact terminal is the only electrical conductor that is electrically connected to the pad and extends to the side of the insulative base that faces away from the chip.

279. The method of claim 261, wherein the steps are performed in the sequence set forth.

280. The method of claim 261, wherein the connection joint is devoid of wire bonds, TAB leads and solder joints.

281. A method of connecting a conductive trace and an insulative base to a semiconductor chip, comprising the following steps in the sequence set forth:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;
forming a conductive trace that includes a routing line and a contact terminal, wherein the routing line includes an unetched portion of the metal layer, and the contact terminal includes a plated metal that contacts the metal base and the metal layer in the via and extends through the insulative base in the via;
mechanically attaching a chip to the laminated structure using an insulative adhesive, wherein the chip includes a conductive pad, the metal base is disposed on a side of the insulative base that faces away from the chip, and the routing line is disposed on a side of the insulative base that faces towards the chip;
forming a connection joint that contacts and electrically connects the routing line and the pad and is spaced from the metal base, wherein the connection joint is formed in an opening that exposes the routing line and the pad and extends through the metal base, the insulative base and the adhesive and is spaced from the contact terminal; and
removing a portion of the metal base that contacts (i) the contact terminal such that none of the metal base contacts the contact terminal and (ii) a portion of the side of the insulative base that faces away from the chip that surrounds and is adjacent to and outside the periphery of the contact terminal.

282. The method of claim 281, wherein forming the contact terminal includes:
electroplating a first portion of the contact terminal into the via and on the metal base without depositing the first portion of the contact terminal on the metal layer; and then
electrolessly depositing a second portion of the contact terminal into the via and on the first portion of the contact terminal and the metal layer without depositing the second portion of the contact terminal on the metal base, wherein the second portion of the contact terminal extends through the insulative base.

283. The method of claim 281, wherein forming the routing line includes:

forming a photoresist layer;
etching the metal layer using the photoresist layer as an etch mask; and
removing the photoresist layer.

284. The method of claim 281, wherein forming the opening includes applying a wet chemical etch to the metal base and then applying a laser that ablates the insulative base and the adhesive.

285. The method of claim 281, wherein forming the connection joint includes electroplating a first metal portion on the routing line and the pad and a second metal portion on the metal base during an electroplating operation in which a plating bus provides current to the metal base, the metal base provides the current to the contact terminal, the contact terminal provides the current to the routing line, and the first and second metal portions are separated from one another.

286. The method of claim 285, wherein the metal base, the metal layer and the first and second metal portions are copper.

287. The method of claim 281, wherein removing the portion of the metal base removes all remaining portions of the metal base.

288. The method of claim 281, wherein the connection joint contacts a surface of the routing line that is disposed above and overlaps and faces away from the pad, and the connection joint contacts a peripheral sidewall of the routing line that is disposed above and overlaps and is orthogonal to the pad.

289. The method of claim 281, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the contact terminal is the only electrical conductor that is electrically connected to the pad and extends to the side of the insulative base that faces away from the chip.

290. The method of claim 281, wherein the connection joint is devoid of wire bonds, TAB leads and solder joints.

291. A method of connecting a conductive trace and an insulative base to a semiconductor chip, comprising the following steps in the sequence set forth:
providing a laminated structure that includes a metal base, an insulative base and a metal layer, wherein the metal base and the metal layer are disposed on opposite sides of the insulative base;
forming a via in the laminated structure that extends through the metal layer and the insulative base and into the metal base;
forming a conductive trace that includes a routing line and a contact terminal, wherein the routing line includes an unetched portion of the metal layer, and the contact terminal includes a plated metal that contacts the metal base and the metal layer in the via and extends through the insulative base in the via;
mechanically attaching a chip to the laminated structure using an insulative adhesive, wherein the chip includes a conductive pad, the metal base is disposed on a side of the insulative base that faces away from the chip, and the routing line is disposed on a side of the insulative base that faces towards the chip;
forming a connection joint that contacts and electrically connects the routing line and the pad and is spaced from the metal base, wherein the connection joint is formed in an opening that exposes the routing line and the pad and extends through the metal base, the insulative base and the adhesive and is spaced from the contact terminal;

depositing an insulator in the opening that contacts the insulative base and the connection joint; and removing a portion of the metal base that contacts (i) the contact terminal such that none of the metal base contacts the contact terminal and (ii) a portion of the side of the insulative base that faces away from the chip that surrounds and is adjacent to and outside the periphery of the contact terminal.

292. The method of claim 291, wherein forming the contact terminal includes:

electroplating a first portion of the contact terminal into the via and on the metal base without depositing the first portion of the contact terminal on the metal layer, and then electrolessly depositing a second portion of the contact terminal into the via and on the first portion of the contact terminal and the metal layer without depositing the second portion of the contact terminal on the metal base; wherein the second portion of the contact terminal extends through the insulative base.

293. The method of claim 291, wherein forming the routing line includes:

forming a photoresist layer;

etching the metal layer using the photoresist layer as an etch mask; and removing the photoresist layer.

294. The method of claim 291, wherein forming the opening includes applying a wet chemical etch to the metal base and then applying a laser that ablates the insulative base and the adhesive.

295. The method of claim 291, wherein forming the connection joint includes electroplating a first metal portion on the routing line and the pad and a second metal portion on the metal base during an electroplating operation in which a plating bus provides current to the metal base, the metal base provides the current to the contact terminal, the contact terminal provides the current to the routing line, and the first and second metal portions are separated from one another.

296. The method of claim 295, wherein the metal base, the metal layer and the first and second metal portions are copper.

297. The method of claim 291, wherein removing the portion of the metal base removes all remaining portions of the metal base.

298. The method of claim 291, wherein the connection joint contacts a surface of the routing line that is disposed above and overlaps and faces away from the pad, and the connection joint contacts a peripheral sidewall of the routing line that is disposed above and overlaps and is orthogonal to the pad.

299. The method of claim 291, wherein the connection joint is the only electrical conductor external to the chip that contacts the pad, the connection joint and the adhesive are the only materials external to the chip that contact the pad, the connection joint and the adhesive are the only materials that contact both the conductive trace and the pad, and the contact terminal is the only electrical conductor that is electrically connected to the pad and extends to the side of the insulative base that faces away from the chip.

300. The method of claim 291, wherein the connection joint is devoid of wire bonds, TAB leads and solder joints.

* * * * *

UNITED STATES PATENT AND TRADEMARK OFFICE
CERTIFICATE OF CORRECTION

PATENT NO. : 6,949,408 B1
DATED : September 27, 2005
INVENTOR(S) : Lin et al.

It is certified that error appears in the above-identified patent and that said Letters Patent is hereby corrected as shown below:

Column 24,
Lines 39 and 42, delete "the" after "wherein".

Column 33,
Line 26, change "point" to -- joint --.

Column 34,
Lines 5 and 8, delete "the" after "wherein".

Column 37,
Line 32, insert -- on -- after "encapsulant".
Line 47, change "foyer" to -- layer --.

Column 42,
Line 62, change "connecting" to -- connection --.

Column 43,
Lines 44 and 47, delete "the" after "wherein".
Line 57, change "connector" to -- connection --.
Line 67, change "joints" to -- joint --.

Column 46,
Lines 1-5, delete the text.
Line 53, change "fist" to -- first --.

Signed and Sealed this

Sixth Day of December, 2005

JON W. DUDAS
*Director of the United States Patent and Trademark Office*